United States Patent
Hong et al.

(10) Patent No.: US 11,996,052 B2
(45) Date of Patent: May 28, 2024

(54) DISPLAY DEVICE AND DRIVING CIRCUIT

(71) Applicant: LG Display Co., Ltd., Seoul (KR)

(72) Inventors: MooKyoung Hong, Gyeonggi-do (KR); Uitaek Jeong, Gyeonggi-do (KR); HyeonWoo Lee, Gyeonggi-do (KR); DongKyu Yang, Seoul (KR); SinKyun Park, Gyeonggi-do (KR); SeungWon Lee, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/976,548

(22) Filed: Oct. 28, 2022

(65) Prior Publication Data
US 2023/0197011 A1    Jun. 22, 2023

(30) Foreign Application Priority Data
Dec. 22, 2021    (KR) .......... 10-2021-0185146

(51) Int. Cl.
*G09G 3/3266*    (2016.01)
*G09G 3/3233*    (2016.01)
*G09G 3/3283*    (2016.01)

(52) U.S. Cl.
CPC ......... *G09G 3/3266* (2013.01); *G09G 3/3233* (2013.01); *G09G 3/3283* (2013.01);
(Continued)

(58) Field of Classification Search
CPC .. G09G 3/3283; G09G 3/3291; G09G 3/3233; G09G 3/3266; G09G 2300/0842; G09G 2300/043; G09G 2300/0413; G09G 2300/0819; G09G 2310/0291; G09G 2310/0286; G09G 2310/08; G09G 2310/0251; G09G 2320/045; G09G 2320/0214; G09G 2320/043; G09G 2320/0295; G09G 2330/028; G09G 2330/12; G09G 2330/021
(Continued)

(56) References Cited

U.S. PATENT DOCUMENTS 10,573,225 B2    2/2020    Lee et al.
2018/0096645 A1    4/2018    Lee et al.
(Continued)

FOREIGN PATENT DOCUMENTS

CN    107886913 A    4/2018
CN    111192550 A    5/2020

*Primary Examiner* — Jimmy H Nguyen
(74) *Attorney, Agent, or Firm* — Birch, Stewart, Kolasch & Birch, LLP

(57) ABSTRACT

A display device can include a display panel having a plurality of subpixels; a gate driving circuit configured to supply a plurality of scan signals to the display panel through a plurality of gate lines, and output a feedback voltage; a data driving circuit configured to supply a plurality of data voltages to the display panel through a plurality of data lines; a power management circuit configured to supply a plurality of driving voltages to the gate driving circuit and the data driving circuit, and supply a compensating high-potential gate voltage to the gate driving circuit based on the feedback voltage transferred from the gate driving circuit. The display device can further include a timing controller configured to control the gate driving circuit, the data driving circuit, and the power management circuit.

21 Claims, 16 Drawing Sheets

(52) U.S. Cl.
CPC ............... *G09G 2300/0413* (2013.01); *G09G 2300/0842* (2013.01); *G09G 2310/0291* (2013.01); *G09G 2310/08* (2013.01); *G09G 2320/0214* (2013.01); *G09G 2320/045* (2013.01); *G09G 2330/021* (2013.01)

(58) Field of Classification Search
USPC ............................................ 345/212, 98, 76
See application file for complete search history.

(56) References Cited

U.S. PATENT DOCUMENTS

2021/0201718 A1\* 7/2021 Ha ............................ G09G 3/32
2022/0028316 A1   1/2022 Xue et al.
2022/0130336 A1\* 4/2022 Hong ................... G09G 3/3266

\* cited by examiner

|  | Case 1 | Case 2 | Case 3 | Case 4 |
|---|---|---|---|---|
| Property | G-S Short | G-S Short | D-S Short | FB Line Open |
| Operation | FT3 Off | FT3 Off | FT3 On | FT3 On |
| Image Error | Horizontal Dim | Horizontal Dim | Normal | Normal |

(a)

(b)

DISPLAY DEVICE AND DRIVING CIRCUIT

CROSS-REFERENCE TO RELATED APPLICATION

This application claims priority to Korean Patent Application No. 10-2021-0185146, filed in the Republic of Korea on Dec. 22, 2021, the entirety of which is hereby incorporated by reference for all purposes as if fully set forth herein.

BACKGROUND OF THE DISCLOSURE

Field

Embodiments of the disclosure relate to a display device and a driving circuit.

Description of Related Art

Representative display devices for displaying an image based on digital data include liquid crystal display (LCD) devices using liquid crystal and organic light emitting display devices using organic light emitting diodes.

Among these display devices, the organic light emitting displays adopt light emitting diodes and thus have fast responsiveness and various merits in contrast ratio, luminous efficiency, brightness, and viewing angle. In this situation, the light emitting diode can be implemented with an inorganic material or an organic material.

The organic light emitting diode display includes light emitting diodes in subpixels arranged on the display panel and enables the light emitting diodes to emit light by controlling the current flowing to the light emitting diodes, thereby controlling the brightness represented by each subpixel while displaying an image.

In such a display device, the display panel may have a plurality of subpixels each including a light emitting element and a subpixel circuit for driving the light emitting element. For example, the subpixel circuit includes a driving transistor for controlling a driving current flowing through the light emitting element, and at least one scan transistor for controlling a gate-source voltage of the driving transistor according to a scan signal. The scan transistor of the subpixel circuit may be controlled by the scan signal output from the gate driving circuit disposed on the substrate of the display panel.

Since the display device includes a display area, which is an area where an image is displayed, and a non-display area, which is an area where an image is not displayed, as the size of the non-display area decreases, the size of the border or bezel of the display device may decrease and the size of the display area may increase.

Accordingly, various methods for reducing the size of the gate driving circuit disposed in the non-display area are being studied.

However, in the process of simplifying the gate driving circuit, the possibility of errors occurring in the gate driving circuit increases. Also, the gate driving circuit includes a plurality of transistors (e.g., each having their own different characteristic values), and the degradation and lifespan of the gate driving integrated circuit GDIC can be determined or limited by the transistors within the gate driving circuit that are most likely to become degraded.

SUMMARY OF THE DISCLOSURE

Accordingly, the inventors of the disclosure provide a display device and a driving circuit capable of effectively detecting an error in the gate driving circuit and compensating for changes that occur in the gate driving circuit over time.

Embodiments of the disclosure can provide a display device and a driving circuit capable of detecting an error in a gate driving circuit by detecting a level change in the high-potential gate voltage supplied to the gate driving circuit.

Embodiments of the disclosure can provide a display device and a driving circuit capable of effectively detecting an error in a gate driving circuit by detecting a level change in the high-potential gate voltage through a data driving circuit.

Embodiments of the disclosure can provide a display device and a driving circuit capable of effectively detecting an error in a gate driving circuit by detecting a level change in the high-potential gate voltage while simultaneously controlling the level of the high-potential gate voltage reflecting the current of the feedback transistor disposed at the output terminal of the gate driving circuit.

Embodiments of the disclosure can provide a display device and a driving circuit capable of detecting an error in a gate driving circuit by detecting a level change in the high-potential gate voltage through a dummy channel.

Embodiments of the disclosure can provide a display device comprising a display panel having a plurality of subpixels, a gate driving circuit configured to supply a plurality of scan signals to the display panel through a plurality of gate lines, a data driving circuit configured to supply a plurality of data voltages to the display panel through a plurality of data lines, a power management circuit configured to supply a plurality of driving voltages to the gate driving circuit and the data driving circuit and supply a compensating high-potential gate voltage to the gate driving circuit based on a feedback voltage transferred from the gate driving circuit, and a timing controller configured to control the gate driving circuit, the data driving circuit, and the power management circuit.

Embodiments of the disclosure can provide a gate driving circuit configured to supply a plurality of scan signals through a plurality of gate lines to a display panel having a plurality of subpixels, comprising a plurality of gate driving integrated circuits, in which at least one of the plurality of gate driving integrated circuits is configured as a feedback gate driving integrated circuit including a feedback circuit, and is configured to receive a compensating high-potential gate voltage generated by a power management circuit using a feedback voltage generated by the feedback circuit.

Embodiments of the disclosure provide a power management circuit supplying a driving voltage to a gate driving circuit supplying a plurality of scan signals to a display panel through a plurality of gate lines, comprising a high-potential gate voltage compensation circuit configured to supply a compensating high-potential gate voltage to the gate driving circuit based on a feedback voltage transferred from the gate driving circuit.

Embodiments of the disclosure provide a data driving circuit supplying a plurality of data voltages to a display panel through a plurality of data lines, comprising an analog-to-digital converter sensing a voltage of a sensing line and converting the voltage into digital data, a characteristic value sensing switch controlling a connection between the sensing line and a node to which a sensing reference voltage is supplied, a gate sensing switch controlling a connection between the sensing line and a node to which a compensating high-potential gate voltage transferred from a power management circuit is supplied, and a sampling switch controlling a connection between the sensing line and the analog-to-digital converter.

According to embodiments of the disclosure, there can be provided a display device and a driving circuit capable of effectively detecting an error in the gate driving circuit.

According to embodiments of the disclosure, there can be provided a display device and a driving circuit capable of detecting an error in a gate driving circuit by detecting a level change in the high-potential gate voltage supplied to the gate driving circuit.

According to embodiments of the disclosure, there can be provided a display device and a driving circuit capable of effectively detecting an error in a gate driving circuit by detecting a level change in the high-potential gate voltage through a data driving circuit.

According to embodiments of the disclosure, there can be provided a display device and a driving circuit capable of effectively detecting an error in a gate driving circuit by detecting a level change in the high-potential gate voltage while simultaneously controlling the level of the high-potential gate voltage reflecting the current of the feedback transistor disposed at the output terminal of the gate driving circuit.

According to embodiments of the disclosure, there can be provided a display device and a driving circuit capable of detecting an error in a gate driving circuit by detecting a level change in the high-potential gate voltage through a dummy channel.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
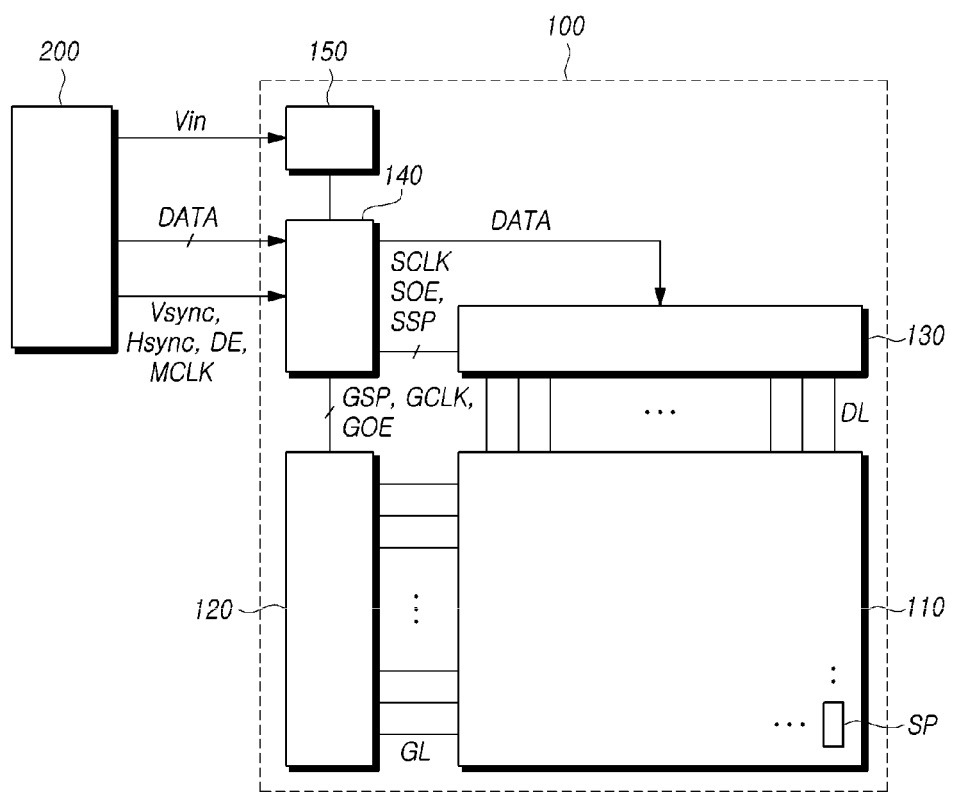
FIG. 1 is a view schematically illustrating a configuration of a display device according to various embodiments of the disclosure.

Hereinafter, some embodiments of the present disclosure will be described in detail with reference to exemplary drawings. In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to," "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element may be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the present disclosure will be described in detail with reference to the accompanying drawings.

FIG. 1 is a view schematically illustrating a configuration of a display device according to various embodiments of the disclosure;

Referring to FIG. 1, a display device 100 according to an embodiment of the disclosure can include a display panel 110 where a plurality of gate lines GL and data lines DL are connected, and a plurality of subpixels SP are arranged in a matrix form, a gate driving circuit 120 driving the plurality of gate lines GL, a data driving circuit 130 supplying a data voltage through the plurality of data lines DL, a timing controller 140 controlling the gate driving circuit 120 and the data driving circuit 130, and a power management circuit (power management integrated circuit (IC)) 150.

The display panel 110 displays an image based on a scan signal transferred from the gate driving circuit 120 through the plurality of gate line GL and the data voltage transferred from the data driving circuit 130 through the plurality of data lines DL.

In the situation of a liquid crystal display, the display panel 110 can include a liquid crystal layer formed between two substrates and can be operated in any known mode, such as a twisted nematic (TN) mode, a vertical alignment (VA) mode, an in-plane switching (IPS) mode, or a fringe field switching (FFS) mode. In the situation of an organic light emitting display, the display panel 110 can be implemented in a top emission scheme, a bottom emission scheme, or a dual-emission scheme.

In the display panel 110, a plurality of pixels can be arranged in a matrix form, and each pixel can include subpixels SP having different colors, e.g., a white subpixel, a red subpixel, a green subpixel, and a blue subpixel, and each subpixel SP can be defined by the plurality of data lines DL and the plurality of gate lines GL.

One subpixel SP can include, e.g., a thin film transistor (TFT) formed at the intersection between one data line DL and one gate line GL, a light emitting element, such as an organic light emitting diode, charged with the data voltage, and a storage capacitor electrically connected to the light emitting element to maintain the voltage.

For example, when the display device 100 having a resolution of 2,160×3,840 includes four subpixels SP of white (W), red (R), green (G), and blue (B), 3,840 data lines DL can be connected to 2,160 gate lines GL and four subpixels WRGB, and thus, there can be provided 3,840× 4=15,360 data lines DL. Each subpixel SP is disposed at the intersection between the gate line GL and the data line DL.

The gate driving circuit 120 can be controlled by the controller 140 to sequentially output scan signals to the plurality of gate lines GL disposed in the display panel 110, controlling the driving timing of the plurality of subpixels SP.

In the display device 100 having a resolution of 2,160× 3,840, sequentially outputting the scan signal to the 2,160 gate lines GL from the first gate line to the 2,160th gate line can be referred to as 2,160-phase driving. Sequentially outputting the scan signal to each unit of four gate lines GL, e.g., sequentially outputting the scan signal to the fifth gate line to the eighth gate line after sequentially outputting the scan signal to the first gate line to the fourth gate line, is referred to as 4-phase driving. In other words, sequentially outputting the scan signal to every N gate lines GL can be referred to as N-phase driving.

The gate driving circuit 120 can include one or more gate driving integrated circuits (GDICs). Depending on driving schemes, the gate driving circuit 120 can be positioned on only one side, or each of two opposite sides, of the display panel 110. The gate driving circuit 120 can be implemented in a gate-in-panel (GIP) form which is embedded in the bezel area of the display panel 110.

The data driving circuit 130 receives image data DATA from the timing controller 140 and converts the received image data DATA into an analog data voltage. Then, as the data voltage is output to each data line DL according to the timing when the scan signal is applied through the gate line GL, each subpixel SP connected to the data line DL displays a light emitting signal having the brightness corresponding to the data voltage.

Likewise, the data driving circuit 130 can include one or more source driving integrated circuits SDIC, and the source driving integrated circuit SDIC can be connected to the bonding pad of the display panel 110 in a tape automated bonding (TAB) type or a chip-on-glass (COG) type or can be disposed directly on the display panel 110.

In some situations, each source driving integrated circuit SDIC can be integrated and disposed on the display panel 110. Further, each source driving integrated circuit SDIC can be implemented in a chip-on-film (COF) type and, in this situation, each source driving integrated circuit SDIC can be mounted on a circuit film and can be electrically connected to the data line DL of the display panel 110 through the circuit film.

The timing controller 140 supplies various control signals to the gate driving circuit 120 and the data driving circuit 130 and controls the operation of the gate driving circuit 120 and the data driving circuit 130. In other words, the timing controller 140 can control the gate driving circuit 120 to output a scan signal according to the timing implemented in each frame and, on the other hand, transfers the image data DATA received from the outside to the data driving circuit 130.

In this situation, the timing controller 140 receives, from an external host system 200, several timing signals including, e.g., a vertical synchronization signal Vsync, a horizontal synchronization signal Hsync, a data enable signal DE, and a main clock MCLK, together with the image data DATA.

The host system 200 can be any one of a television (TV) system, a set-top box, a navigation system, a personal computer (PC), a home theater system, a mobile device, and a wearable device.

Accordingly, the timing controller 140 can generate a control signal according to various timing signals received from the host system 200 and transfers the control signal to the gate driving circuit 120 and the data driving circuit 130.

For example, the timing controller 140 outputs several gate control signals including, e.g., a gate start pulse GSP, a gate clock GCLK, and a gate output enable signal GOE, to control the gate driving circuit 120. The gate start pulse GSP controls the timing at which one or more gate driving integrated circuits GDIC constituting the gate driving circuit 120 start operation. The gate clock GCLK is a clock signal commonly input to one or more gate driving integrated circuits GDIC and controls the shift timing of the scan signal. The gate output enable signal GOE designates timing information about one or more gate driving integrated circuits GDICs.

The timing controller 140 outputs various data control signals including, e.g., a source start pulse SSP, a source sampling clock SCLK, and a source output enable signal SOE, to control the data driving circuit 130. The source start pulse SSP controls the timing at which one or more source driving integrated circuits SDIC constituting the data driving circuit 130 start data sampling. The source sampling clock SCLK is a clock signal that controls the timing of sampling data in the source driving integrated circuit SDIC. The source output enable signal SOE controls the output timing of the data driving circuit 130.

The display device 100 can further include a power management circuit 150 that supplies various voltages or currents to, e.g., the display panel 110, the gate driving circuit 120, and the data driving circuit 130 or controls various voltages or currents to be supplied.

The power management circuit 150 adjusts the direct current (DC) input voltage Vin supplied from the host system 200, generating power required to drive the display panel 100, the gate driving circuit 120, and the data driving circuit 130.

The subpixel SP is positioned at the intersection between the gate line GL and the data line DL, and a light emitting element can be disposed in each subpixel SP. For example, the organic light emitting diode display can include a light emitting element, such as an organic light emitting diode, in each subpixel SP and can display an image by controlling the current flowing to the light emitting element according to the data voltage.

The display device 100 can be one of various types of devices, such as liquid crystal displays, organic light emitting diode displays, or plasma display panels.

Figure 2:
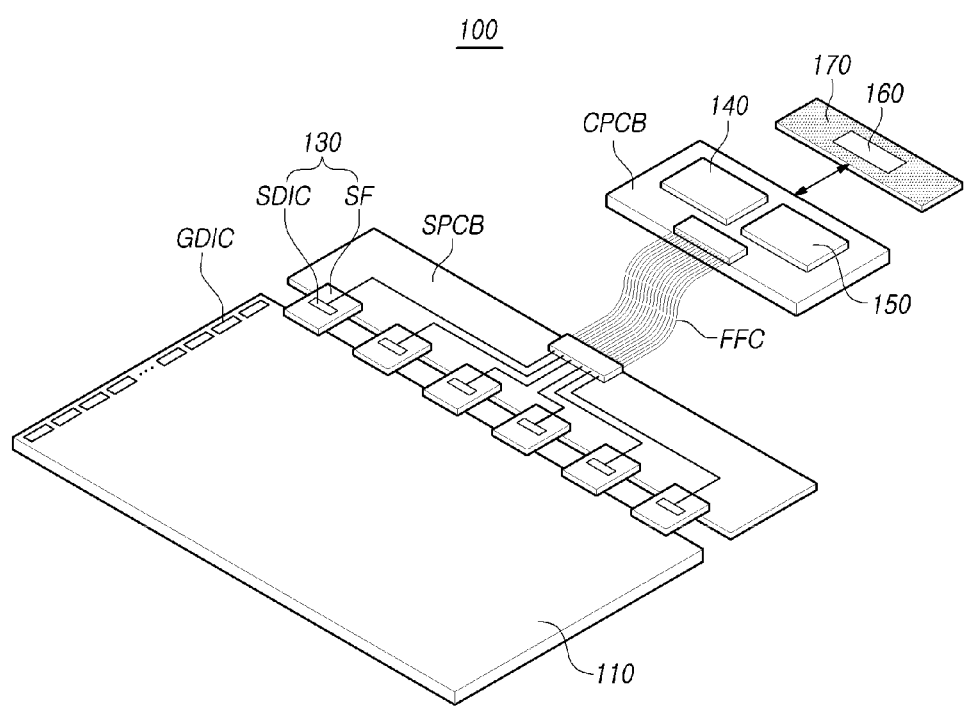
FIG. 2 is a view illustrating an example of a system of a display device according to embodiments of the disclosure.

FIG. 2 is a view illustrating an example of a system of a display device according to embodiments of the disclosure.

Referring to FIG. 2, in the display device 100 according to embodiments of the disclosure, the source driving integrated circuit SDIC included in the data driving circuit 130 is implemented in a chip-on-film (COF) type among various types (e.g., TAB, COG, or COF), and the gate driving circuit 120 is implemented in a gate-in-panel (GIP) type among various types (e.g., TAB, COG, COF, or GIP).

When the gate driving circuit 120 is implemented in the GIP type, the plurality of gate driving integrated circuits GDIC included in the gate driving circuit 120 can be directly formed in the bezel area of the display panel 110. In this situation, the gate driving integrated circuits GDIC can receive various signals (e.g., a clock signal, a gate high-level voltage, a gate low-level voltage, etc.) necessary for generating scan signals through gate driving-related signal lines disposed in the bezel area.

Likewise, one or more source driving integrated circuits SDIC included in the data driving circuit 130 each can be mounted on the source film SF, and one side of the source film SF can be electrically connected with the display panel 110. Lines for electrically connecting the source driver integrated circuit SDIC and the display panel 110 can be disposed on the source film SF.

The display device 100 can include at least one source printed circuit board SPCB for circuit connection between a plurality of source driving integrated circuits SDIC and other devices and a control printed circuit board CPCB for mounting control components and various electric devices.

The other side of the source film SF where the source driving integrated circuit SDIC is mounted can be connected to at least one source printed circuit board SPCB. In other words, one side of the source film SF where the source driving integrated circuit SDIC is mounted can be electrically connected with the display panel 110, and the other side thereof can be electrically connected with the source printed circuit board SPCB.

The timing controller 140 and the power management circuit (power management IC) 150 can be mounted on the control printed circuit board CPCB. The timing controller 140 can control the operation of the data driving circuit 130 and the gate driving circuit 120. The power management circuit 150 can supply driving voltage or current to the display panel 110, the data driving circuit 130, and the gate driving circuit 120 and control the supplied voltage or current.

At least one source printed circuit board SPCB and control printed circuit board CPCB can be circuit-connected through at least one connection member. The connection member can include, e.g., a flexible printed circuit FPC or a flexible flat cable FFC. The at least one source printed circuit board SPCB and control printed circuit board CPCB can be integrated into a single printed circuit board.

The display device 100 can further include a set board 170 electrically connected to the control printed circuit board CPCB. In this situation, the set board 170 can also be referred to as a power board. A main power management circuit (M-PMC) 160 for managing the overall power of the display device 100 can be disposed on the set board 170. The main power management circuit 160 can interwork with the power management circuit 150.

In the so-configured display device 100, the driving voltage is generated in the set board 170 and transferred to the power management circuit 150 in the control printed circuit board CPCB. The power management circuit 150 transfers a driving voltage necessary for display driving or characteristic value sensing to the source printed circuit board SPCB through the flexible printed circuit FPC or flexible flat cable FFC. The driving voltage transferred to the source printed circuit board SPCB is supplied to emit light or sense a specific subpixel SP in the display panel 110 through the source driving integrated circuit SDIC.

Each of the subpixels SP arranged in the display panel 110 in the display device 100 can include a light emitting element and a circuit element, e.g., a driving transistor, for driving the organic light emitting diode.

The type and number of circuit elements constituting each subpixel SP can be varied depending on functions to be provided and design schemes.

Figure 3:
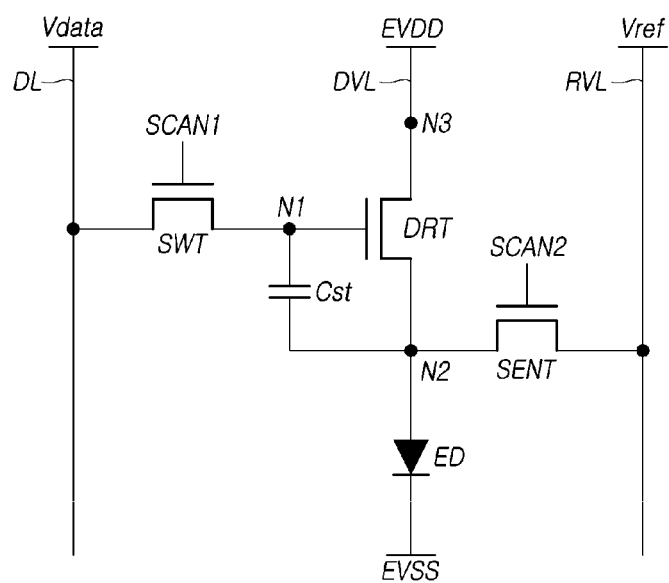
FIG. 3 is a view illustrating an example of a circuit constituting a subpixel in a display device according to embodiments of the disclosure.

FIG. 3 is a view illustrating an example of a circuit constituting a subpixel in a display device according to embodiments of the disclosure.

Referring to FIG. 3, in the display device 100 according to embodiments of the disclosure, the subpixel SP can include one or more transistors and a capacitor and can have a light emitting element disposed therein.

For example, the subpixel SP can include a driving transistor DRT, a switching transistor SWT, a sensing transistor SENT, a storage capacitor Cst, and a light emitting diode ED.

The driving transistor DRT includes the first node N1, second node N2, and third node N3. The first node N1 of the driving transistor DRT can be a gate node to which the data voltage Vdata is applied from the data driving circuit 130 through the data line DL when the switching transistor SWT is turned on.

The second node N2 of the driving transistor DRT can be electrically connected with the anode electrode of the light emitting diode ED and can be the source node or drain node.

The third node N3 of the driving transistor DRT can be electrically connected with the driving voltage line DVL to which the subpixel driving voltage EVDD is applied and can be the drain node or the source node.

In this situation, during a display driving period, a subpixel driving voltage EVDD necessary for displaying an image can be supplied to the driving voltage line DVL. For example, the subpixel driving voltage EVDD necessary for displaying an image can be 27V.

The switching transistor SWT is electrically connected between the first node N1 of the driving transistor DRT and the data line DL, and the gate line GL is connected to the gate node. Thus, the switching transistor SWT is operated according to the first scan signal SCAN1 supplied through the gate line GL. When turned on, the switching transistor SWT transfers the data voltage Vdata supplied through the data line DL to the gate node of the driving transistor DRT, thereby controlling the operation of the driving transistor DRT.

The sensing transistor SENT is electrically connected between the second node N2 of the driving transistor DRT and the reference voltage line RVL, and the gate line GL is connected to the gate node. The sensing transistor SENT is operated according to the second scan signal SCAN2 supplied through the gate line GL. When the sensing transistor SENT is turned on, a reference voltage Vref supplied through the reference voltage line RVL is transferred to the second node N2 of the driving transistor DRT.

In other words, as the switching transistor SWT and the sensing transistor SENT are controlled, the voltage of the first node N1 and the voltage of the second node N2 of the driving transistor DRT are controlled, so that the current for driving the light emitting diode ED can be supplied.

The gate nodes of the switching transistor SWT and the sensing transistor SENT can be commonly connected to one gate line GL or can be connected to different gate lines GL. An example is shown in which the switching transistor SWT and the sensing transistor SENT are connected to different gate lines GL, in which the switching transistor SWT and the sensing transistor SENT can be independently controlled by the first scan signal SCAN1 and the second scan signal SCAN2 transferred through different gate lines GL.

In contrast, if the switching transistor SWT and the sensing transistor SENT are connected to one gate line GL, the switching transistor SWT and the sensing transistor SENT can be simultaneously controlled by the first scan signal SCAN1 or second scan signal SCAN2 transferred through one gate line GL, and the aperture ratio of the subpixel SP can be increased.

The transistor disposed in the subpixel SP can be an n-type transistor or a p-type transistor and, in the shown example, the transistor is an n-type transistor.

The storage capacitor Cst is electrically connected between the first node N1 and second node N2 of the driving transistor DRT and maintains the data voltage Vdata during one frame.

The storage capacitor Cst can also be connected between the first node N1 and third node N3 of the driving transistor DRT depending on the type of the driving transistor DRT. The anode electrode of the light emitting diode ED can be electrically connected with the second node N2 of the driving transistor DRT, and a base voltage EVSS can be applied to the cathode electrode of the light emitting diode ED.

The base voltage EVSS can be a ground voltage or a voltage higher or lower than the ground voltage. The base voltage EVSS can be varied depending on the driving state. For example, the base voltage EVSS at the time of display driving and the base voltage EVSS at the time of sensing driving can be set to differ from each other.

The switching transistor SWT and the sensing transistor SENT can be referred to as scan transistors controlled through scan signals SCAN1 and SCAN2.

The structure of the subpixel SP can further include one or more transistors or, in some situations, further include one or more capacitors.

To effectively sense a characteristic value, e.g., threshold voltage or mobility, of the driving transistor DRT, the display device 100 of the disclosure can use a method for measuring the current flowed by the voltage charged to the storage capacitor Cst during a characteristic value sensing period of the driving transistor DRT, which is called current sensing.

In other words, it is possible to figure out the characteristic value, or a variation in the characteristic value, of the driving transistor DRT in the subpixel SP by measuring the current flowed by the voltage charged to the storage capacitor Cst during the characteristic value sensing period of the driving transistor DRT.

In this situation, the reference voltage line RVL serves not only to transfer the reference voltage Vref but also as a sensing line for sensing the characteristic value of the driving transistor DRT in the subpixel. Thus, the reference voltage line RVL can also be referred to as a sensing line or a sensing channel.

More specifically, the characteristic value or a change in the characteristic value of the driving transistor DRT can correspond to a difference between the gate node voltage and the source node voltage of the driving transistor DRT.

The compensation for the characteristic value of the driving transistor DRT can be performed by external compensation that senses and compensates for the characteristic value of the driving transistor DRT using an external compensation circuit or internal compensation that senses and compensates for the characteristic value of the driving transistor DRT inside the subpixel SP, rather than using an additional external configuration.

In this situation, the external compensation can be performed before the display device 100 is shipped out, and the internal compensation can be performed after the display device 100 is shipped out. However, internal compensation and external compensation can be performed together even after the display device 100 is shipped out.

Figure 4:
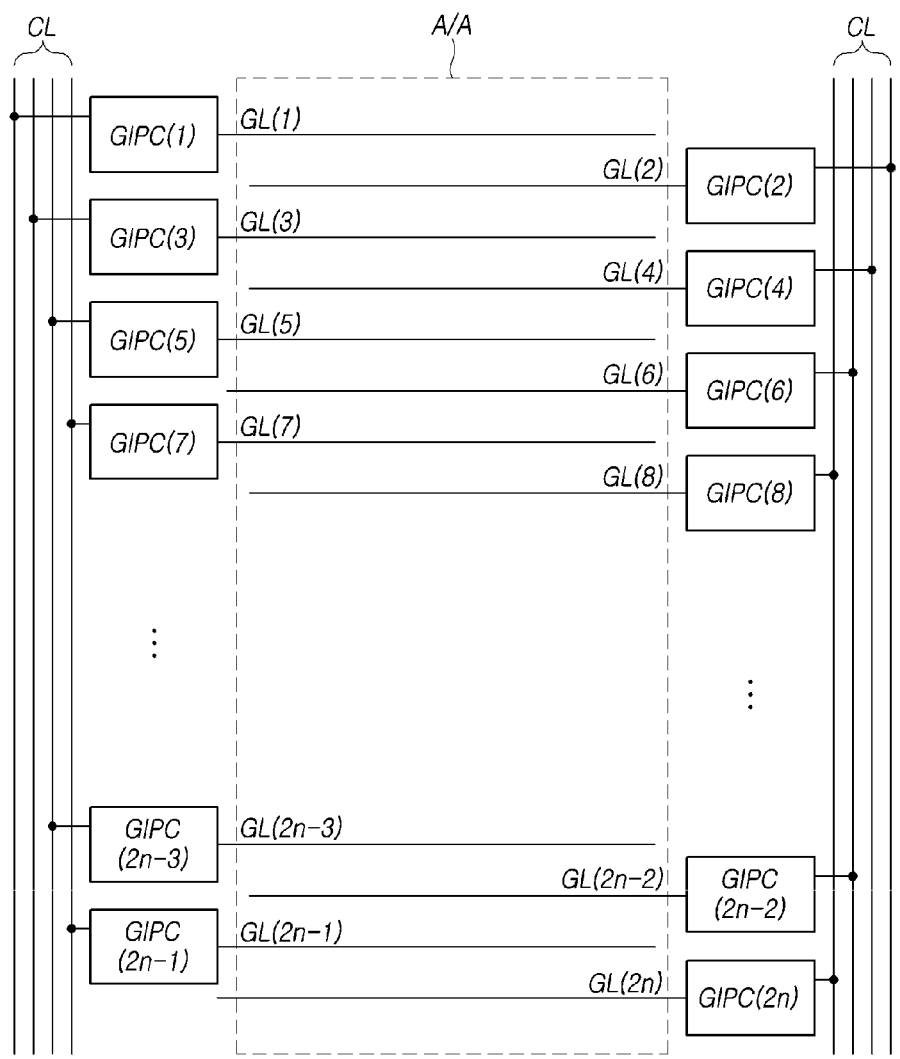
FIG. 4 is a view illustrating an example of a display panel in which a gate driving circuit is implemented in a GIP type in a display device according to embodiments of the disclosure.

FIG. 4 is a view illustrating an example of a display panel in which a gate driving circuit is implemented in a GIP type in a display device according to embodiments of the disclosure.

Referring to FIG. 4, in the display device 100 according to embodiments of the disclosure, 2n gate lines GL(1) to GL(2n) (where n is a natural number) can be disposed in the display area A/A for displaying an image in the display panel 110.

In this situation, the gate driving circuit 120 can include 2n GIP circuits GIPC corresponding to 2n gate lines GL(1) to GL(2n) and embedded and disposed in the non-display area corresponding to the outer portion of the display area A/A of the display panel 110 (e.g., along an edge).

Accordingly, the 2n GIP circuits GIPC can output the scan signal SCAN to the 2n gate lines GL(1) to GL(2n).

As such, when the gate driving circuit 120 is implemented in a GIP type, it is not necessary to form a separate integrated circuit having a gate driving function and bond it to the display panel 110. Thus, it is possible to reduce the number of integrated circuits and omit the process of connecting the integrated circuits to the display panel 110. It is also possible to reduce the size of the bezel area for bonding the integrated circuit in the display panel 110.

The 2n GIP circuits GIPC can be denoted as GIPC(1), GIPC(2), GIPC(2n) to be distinguished from each other and to identify a correspondence relationship between the 2n gate lines GL(1) to GL(2n).

Shown here is an example in which the 2n GIP circuits GIPC(1) to GIPC(2n) are disposed on two divided sides of the display area A/A. For example, among the 2n GIP circuits GIPC(1) to GIPC(2n), the odd-numbered GIP circuits GIPC(1), GIPC(3), . . . , GIPC(2n−1) can drive the odd-numbered gate lines GL(1), GL(3), . . . , GL(2n−1). Among the 2n GIP circuits GIPC(1) to GIPC(2n), the even-numbered GIP circuits GIPC(2), GIPC(4), . . . , GIPC(2n) can drive the even-numbered gate lines GL(2), GL(4), . . . , GL(2n).

Alternatively, the 2n GIP circuits GIPC(1) to GIPC(2n) can be disposed on only one side of the display area A/A.

A plurality of clock signal lines CL for transferring gate clocks necessary for generating and outputting the scan signal SCAN to the gate driving circuit 120 can be disposed in the non-display area corresponding to the outer portion of the display area A/A of the display panel 110.

Figure 5:
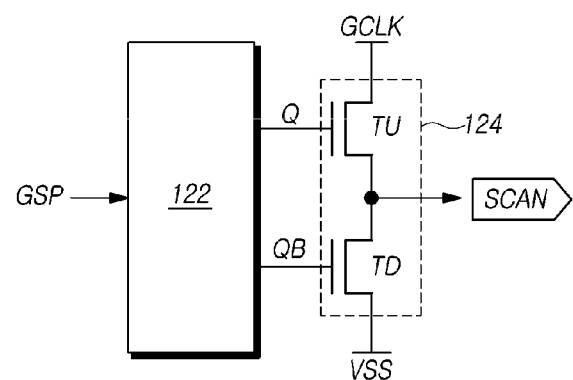
FIG. 5 is a block diagram schematically illustrating a configuration of a GIP circuit in a display device according to embodiments of the disclosure.

FIG. 5 is a block diagram schematically illustrating a configuration of a GIP circuit in a display device according to embodiments of the disclosure.

Referring to FIG. 5, in the display device 100 according to embodiments of the disclosure, one GIP circuit GIPC can include a shift register 122 and a buffer circuit 124.

The GIP circuit GIPC starts to operate according to the gate start pulse GSP and outputs the scan signal SCAN according to the gate clock GCLK. The scan signal SCAN output from the GIP circuit GIPC is sequentially shifted and sequentially supplied through the gate line GL.

The buffer circuit 124 has two nodes Q and QB important to the gate driving state and can include a pull-up transistor TU and a pull-down transistor TD. The gate node of the pull-up transistor TU can correspond to the Q node, and the gate node of the pull-down transistor TD can correspond to the QB node.

The shift register 122 can also be referred to as a shift logic circuit and can be used to generate the scan signal SCAN in synchronization with the gate clock GCLK.

The shift register 122 can control the Q node and the QB node connected to the buffer circuit 124 so that the buffer circuit 124 can output the scan signal SCAN and, to this end, can include a plurality of transistors.

The shift register 122 starts to generate the scan signal SCAN, and the output of the shift register 122 is sequentially turned on according to the gate clock GCLK. In other words, it is possible to transfer the logic state for sequentially determining on/off of the gate line GL by controlling the output time of the shift register 122 using the gate clock GCLK.

According to the shift register 122, the respective voltage states of the Q node and the QB node of the buffer circuit 124 can be different. Accordingly, the buffer circuit 124 can output a voltage for turning on the corresponding gate line GL (e.g., which corresponds to a high-level voltage or low-level voltage and can be, e.g., a clock signal having the gate high-level voltage VGH) to the corresponding gate line GL or a voltage for turning on the corresponding gate line GL (e.g., which corresponds to a low-level voltage or high-level voltage and can be, e.g., a base voltage VSS having the gate low-level voltage VGL) to the corresponding gate line GL.

Meanwhile, one GIP circuit GIPC can further include a level shifter in addition to the shift register 122 and the buffer circuit 124.

In this situation, the shift register 122 and the buffer circuit 124 constituting the GIP circuit GIPC can be connected in various structures.

Figure 6:
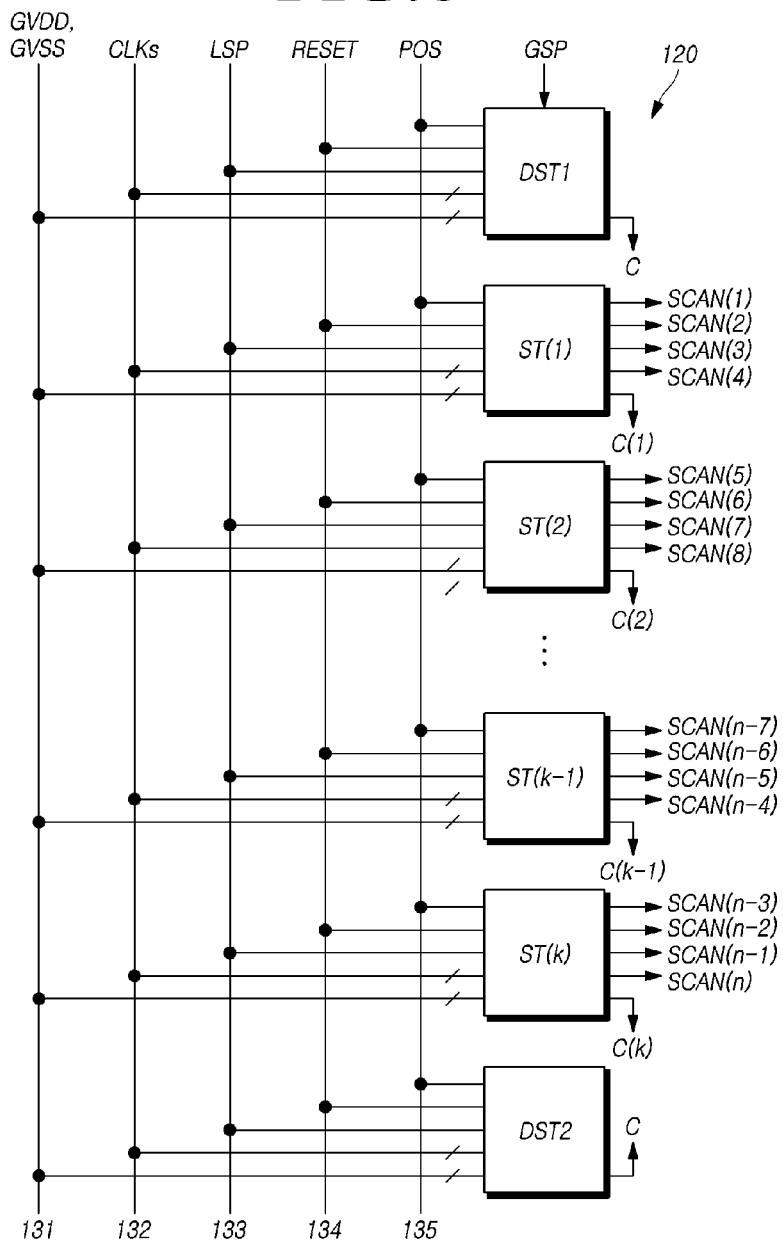
FIG. 6 is a view illustrating a configuration of a plurality of stage circuits constituting a gate driving circuit according to embodiments of the disclosure.

FIG. 6 is a view illustrating a configuration of a plurality of stage circuits constituting a gate driving circuit according to embodiments of the disclosure.

Referring to FIG. 6, the gate driving circuit 120 according to another embodiment of the disclosure can include first to kth stage circuits ST(1) to ST(k) (where k is a positive integer greater than zero), a gate driving voltage line 131, a clock signal line 132, a line sensing preparation signal line 133, and a reset signal line 134.

The gate driving circuit 120 can further include a previous dummy stage circuit DST1 disposed before the first stage circuit ST(1) and a subsequent dummy stage circuit DST2 disposed after the kth stage circuit ST(k).

The gate driving voltage line 131 applies the high-potential gate voltage GVDD and the low-potential gate voltage GVSS supplied from the power management circuit 150 to each of the first to kth stage circuits ST(1) to ST(k), the previous dummy stage circuit DST1, and the subsequent dummy stage circuit DST2.

The gate driving voltage line 131 can include a plurality of high-potential gate voltage lines supplying a plurality of high-potential gate voltages having different voltage levels and a plurality of low-potential gate voltage lines supplying a plurality of low-potential gate voltages having different voltage levels.

For example, the gate driving voltage line 131 can include three high-potential gate voltage lines respectively supplying a first high-potential gate voltage GVDD1, a second high-potential gate voltage GVDD2, and a third high-potential gate voltage GVDD3 having different voltage levels and three low-potential gate voltage lines respectively supplying a first low-potential gate voltage GVSS1, a second low-potential gate voltage GVSS2, and a third low-potential gate voltage GVSS3 having different voltage levels. However, this is merely an example, and the number of lines included in the gate driving voltage line 131 can vary according to embodiments.

The clock signal line 132 supplies a plurality of clock signals CLKs supplied from the timing controller 140, e.g., a carry clock signal or a scan clock signal, to each of the first to kth stage circuits ST(1) to ST(k), the previous dummy stage circuit DST1, and the subsequent dummy stage circuit DST2.

The line sensing preparation signal line 133 supplies the line sensing preparation signal LSP supplied from the timing controller 140 to the first to kth stage circuits ST(1) to ST(k).

Optionally, the line sensing preparation signal line 133 can be additionally connected to the previous dummy stage circuit DST1.

The reset signal line 134 transmits the reset signal RESET supplied from the timing controller 140 to each of the first to kth stage circuits ST(1) to ST(k), the previous dummy stage circuit DST1, and the subsequent dummy stage circuit DST2.

The panel-on signal line 135 transmits the panel-on signal POS supplied from the timing controller 140 to each of the first to kth stage circuits ST(1) to ST(k), the previous dummy stage circuit DST1, and the subsequent dummy stage circuit DST2.

Lines for supplying other signals in addition to the shown lines 131, 132, 133, and 134 can be additionally connected with the first to kth stage circuits ST(1) to ST(k), the previous dummy stage circuit DST1 and the subsequent dummy stage circuit DST2. For example, a line for supplying the gate start pulse GSP to the previous dummy stage circuit DST1 can be additionally connected to the previous dummy stage circuit DST1.

The previous dummy stage circuit DST1 outputs a previous carry signal C in response to the input of the gate start pulse GSP supplied from the timing controller 140.

The previous carry signal C can be supplied to any one of the first to kth stage circuits ST(1) to ST(k).

The subsequent dummy stage circuit DST2 outputs a subsequent carry signal C. The subsequent carry signal C can be supplied to any one of the first to kth stage circuits ST(1) to ST(k).

The first to kth stage circuits ST(1) to ST(k) can be connected to each other stepwise or in a cascaded manner.

The first to kth stage circuits ST(1) to ST(k) each output j (where j is a positive integer greater than zero) scan signals SCAN and one carry signal C. In other words, any stage circuit outputs the first to jth scan signals and one carry signal C.

For example, each stage circuit outputs four scan signals SCAN and one carry signal C. For example, the first stage circuit ST(1) outputs a first scan signal SCAN(1), a second scan signal SCAN(2), a third scan signal SCAN(3), and a fourth scan signal (SCAN(4) and a first carry signal C(1), and the second stage circuit ST(2) outputs a fifth scan signal SCAN(5), a sixth scan signal SCAN(6), a seventh scan signal SCAN(7), and an eighth scan signal SCAN(8) and a second carry signal C(2). Thus, in the present embodiment, j is 4.

The number of scan signals output from the first to kth stage circuits ST(1) to ST(k) matches the number n of the gate lines 15 disposed on the display panel 10. As described above, each stage circuit outputs j scan signals. Therefore, the equation j×k=n is established.

For example, when j=4, the number k of the stage circuits is ¼ of the number n of the gate lines GL. However, the number of scan signals output by each stage circuit is not limited thereto. In other words, in the embodiment of the disclosure, each stage circuit can output one, two, or three scan signals or can output five or more scan signals. The number of stage circuits can vary according to the number of scan signals output by each stage circuit.

The scan signal SCAN output from the first to kth stage circuits ST(1) to ST(k) can be a scan signal for sensing the threshold voltage of the driving transistor DRT and can be a gate signal for displaying an image. The carry signals C output from the first to kth stage circuits ST(1) to ST(k) can be supplied to different stage circuits, respectively. The carry signal supplied from the previous stage circuit to any stage circuit is referred to as a previous stage carry signal, and the carry signal supplied from the subsequent stage circuit is referred to as a subsequent carry signal.

Figure 7:
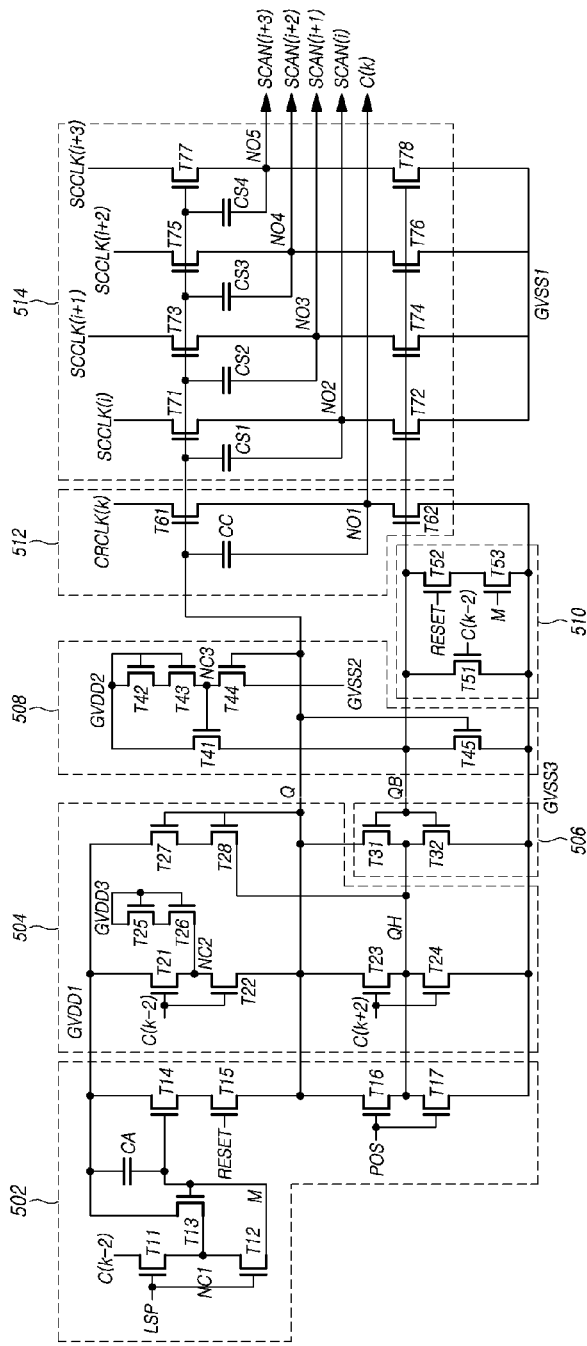
FIG. 7 is a view illustrating a gate driving integrated circuit constituting a gate driving circuit in a display driving circuit according to embodiments of the disclosure.

FIG. 7 is a view illustrating a gate driving integrated circuit constituting a gate driving circuit in a display driving circuit according to embodiments of the disclosure.

Referring to FIG. 7, the gate driving integrated circuit GDIC according to embodiments of the disclosure can include an M node, a Q node, and a QB node, and can include a line selection unit 502, a Q node control unit 504, a Q node stabilization unit 506, an inverter unit 508, a QB node stabilization unit 510, a carry signal output unit 512, and a scan signal output unit 514.

The line selection unit 502 charges the M node based on the carry signal C(k−2) of the previous stage in response to the input of the line sensing preparation signal LSP. In response to the input of the reset signal RESET, the line selection unit 502 charges the Q node to the level of the first high-potential gate voltage GVDD1 based on the charging voltage of the M node. The line selection unit 502 discharges or resets the Q node to the level of the third low-potential gate voltage GVSS3 in response to the input of the panel-on signal POS.

The line selection unit 502 includes first to seventh transistors T11 to T17 and a precharging capacitor CA.

The first transistor T11 and the second transistor T12 are connected between the first high-potential gate voltage line transferring the first high-potential gate voltage GVDD1 and the M node. The first transistor T11 and the second transistor T12 are connected in series with each other.

The first transistor T11 outputs the previous carry signal C(k−2) to the first connection node NC1 in response to the input of the line sensing preparation signal LSP.

The second transistor T12 electrically connects the first connection node NC1 to the M node in response to the input of the line sensing preparation signal LSP. For example, as the line sensing preparation signal LSP of high voltage is input to the first transistor T11 and the second transistor T12, the first transistor T11 and the second transistor T12 are simultaneously turned on so that the M node is charged to the level of the first high-potential gate voltage GVDD1.

The third transistor T13 is turned on when the voltage level of the M node is the high level, supplying the first high-potential gate voltage GVDD1 to the first connection node NC1. When the first high-potential gate voltage GVDD1 is supplied to the first connection node NC1, a voltage difference between the gate voltage of the first transistor T11 and the first connection node NC1 increases.

Accordingly, when the low-level line sensing preparation signal LSP is input to the gate node of the first transistor T11 so that the first transistor T11 is turned off, the first transistor T11 can remain in the fully turned-off state due to the voltage difference between the gate voltage of the first transistor T11 and the first connection node NC1. Accordingly, current leakage of the first transistor T11 and the voltage drop of the M node can be prevented, so that the voltage of the M node can remain stable.

The precharging capacitor CA is connected between the first high-potential gate voltage line transferring the first high-potential gate voltage GVDD1 and the M node, storing the difference between the first high-potential gate voltage GVDD1 and the voltage charged in the M node.

If the first transistor T11, the second transistor T12, and the third transistor T13 are turned on, the precharging capacitor CA stores the high voltage of the previous carry signal C(k−2). If the first transistor T11, the second transistor T12, and the third transistor T13 are turned off, the precharging capacitor CA maintains the voltage of the M node as the stored voltage for a predetermined time.

The fourth transistor T14 and the fifth transistor T15 are connected between the first high-potential gate voltage line that transfers the first high-potential gate voltage GVDD1 and the Q node. The fourth transistor T14 and the fifth transistor T15 are connected in series with each other.

The fourth transistor T14 and the fifth transistor T15 charge the Q node with the first high-potential gate voltage GVDD1 in response to the M node voltage and the input of the reset signal RESET.

The fourth transistor T14 is turned on when the voltage of the M node is at a high level to transfer the first high-potential gate voltage GVDD1 to the shared node of the fourth transistor T14 and the fifth transistor T15.

The fifth transistor T15 is turned on by the high-level reset signal RESET to supply the voltage of the shared node to the Q node. Accordingly, if the fourth transistor T14 and the fifth transistor T15 are simultaneously turned on, the Q node is charged with the first high-potential gate voltage GVDD1.

The sixth transistor T16 and the seventh transistor T17 are connected between the Q node and a third low-potential gate voltage line that transfers the third low-potential gate voltage GVSS3. The sixth transistor T16 and the seventh transistor T17 are connected in series with each other.

The sixth transistor T16 and the seventh transistor T17 discharge the Q node to the third low-potential gate voltage GVSS3 in response to the input of the panel-on signal POS. Discharging the Q node to the third low-potential gate voltage GVSS3 can be expressed as resetting the Q node.

The seventh transistor T17 is turned on by the input of the high-level panel-on signal POS to supply the third low-potential gate voltage GVSS3 to the QH node.

The sixth transistor T16 is turned on by the input of the high-level panel-on signal POS to electrically connect the Q node and the QH node. Accordingly, if the sixth transistor T16 and the seventh transistor T17 are simultaneously turned on, the Q node is discharged or reset to the third low-potential gate voltage GVSS3.

The Q node control unit 504 charges the Q node to the level of the first high-potential gate voltage GVDD1 in response to the input of the previous carry signal C(k−2) and discharges the Q node to the level of the third low-potential gate voltage GVSS3 in response to the input of the subsequent carry signal C(k+2).

The Q node control unit 504 includes first to eighth transistors T21 to T28.

The first transistor T21 and the second transistor T22 are connected between the first high-potential gate voltage line that transfers the first high-potential gate voltage GVDD1 and the Q node. The first transistor T21 and the second transistor T22 are connected in series with each other.

The first transistor T21 and the second transistor T22 charge the Q node to the first high-potential gate voltage GVDD1 level in response to the input of the previous carry signal C(k−2).

The first transistor T21 is turned on by the input of the previous carry signal C(k−2) to supply the first high-potential gate voltage GVDD1 to the second connection node NC2.

The second transistor T22 is turned on by the input of the previous carry signal C(k−2) to electrically connect the second connection node NC2 and the Q node. Accordingly, if the first transistor T21 and the second transistor T22 are simultaneously turned on, the first high-potential gate voltage GVDD1 is supplied to the Q node.

The fifth transistor T25 and the sixth transistor T26 are connected to the third high-potential gate voltage line which transfers the third high-potential gate voltage GVDD3. The fifth transistor T25 and the sixth transistor T26 supply the third high-potential gate voltage GVDD3 to the second connection node NC2 in response to the third high-potential gate voltage GVDD3.

The fifth transistor T25 and the sixth transistor T26 are simultaneously turned on by the third high-potential gate voltage GVDD3 to always supply the third high-potential gate voltage GVDD3 to the second connection node NC2, thereby increasing the voltage difference between the gate voltage of the first transistor T21 and the second connection node NC2. Accordingly, when the low-level previous carry signal C(k−2) is input to the gate node of the first transistor T21 so that the first transistor T21 is turned off, the first transistor T21 can remain in the fully turned-off state due to the voltage difference between the gate voltage of the first transistor T21 and the second connection node NC2.

Accordingly, current leakage of the first transistor T21 and resultant voltage drop of the Q node can be prevented, so that the voltage of the Q node can remain stable.

For example, when the threshold voltage of the first transistor T21 is negative (−), the gate-source voltage Vgs of the first transistor T21 remains negative (−) due to the third high-potential gate voltage GVDD3 supplied to the drain electrode.

Accordingly, when the low-level previous carry signal C(k−2) is input to the gate node of the first transistor T21 so that the first transistor T21 is turned off, the first transistor T21 maintains the fully turned-off state, preventing leakage current.

The third high-potential gate voltage GVDD3 is set to a voltage level lower than the first high-potential gate voltage GVDD1.

The third transistor T23 and the fourth transistor T24 are connected between the Q node and a third low-potential gate voltage line that transfers the third low-potential gate voltage GVSS3. The third transistor T23 and the fourth transistor T24 are connected in series with each other.

The third transistor T23 and the fourth transistor T24 discharge the Q node and the QH node to the third low-potential gate voltage GVSS3 level in response to the input of the subsequent carry signal C(k+2).

The fourth transistor T24 is turned on according to the input of the subsequent carry signal C(k+2) to discharge the QH node to the third low-potential gate voltage GVSS3 level. The third transistor T23 is turned on according to the input of the subsequent carry signal C(k+2) to electrically connect the Q node and the QH node. Accordingly, if the third transistor T23 and the fourth transistor T24 are simultaneously turned on, the Q node and the QH node each are discharged or reset to the level of the third low-potential gate voltage GVSS3.

The seventh transistor T27 and the eighth transistor T28 are connected between the first high-potential gate voltage line that transfers the first high-potential gate voltage GVDD1 and the Q node and between the first high-potential gate voltage line that transfers the first high-potential gate voltage GVDD1 and the QH node. The seventh transistor T27 and the eighth transistor T28 are connected in series to each other.

The seventh transistor T27 and the eighth transistor T28 supply the first high-potential gate voltage GVDD1 to the QH node in response to the voltage of the Q node. The seventh transistor T27 is turned on when the voltage of the Q node is at a high level to supply the first high-potential gate voltage GVDD1 to the shared node of the seventh transistor T27 and the eighth transistor T28.

The eighth transistor T28 is turned on when the voltage of the Q node is at a high level to electrically connect the shared node and the QH node. Accordingly, the seventh transistor T27 and the eighth transistor T28 are simultaneously turned on when the voltage of the Q node is at a high level to supply the first high-potential gate voltage GVDD1 to the QH node.

If the first high-potential gate voltage GVDD1 is supplied to the QH node, a voltage difference between the gate node of the third transistor T23 and the QH node increases. Accordingly, when the low-level subsequent carry signal C(k+2) is input to the gate node of the third transistor T23 so that the third transistor T23 is turned off, the third transistor T23 can remain in the fully turned-off state due to the voltage difference between the gate voltage of the third transistor T23 and the QH node. Accordingly, current leakage of the third transistor T23 and resultant voltage drop of the Q node can be prevented, so that the voltage of the Q node can remain stable.

The Q node stabilization unit 506 discharges the Q node and the QH node to the level of the third low-potential gate voltage GVSS3 in response to the voltage of the QB node. The Q node stabilization unit 506 can include a first transistor T31 and a second transistor T32. The first transistor T31 and the second transistor T32 are connected between the Q node and a third low-potential gate voltage line that transfers the third low-potential gate voltage GVSS3. The first transistor T31 and the second transistor T32 are connected in series with each other.

The first transistor T31 and the second transistor T32 discharge the Q node and the QH node to the level of the third low-potential gate voltage GVSS3 in response to the voltage of the QB node. The second transistor T32 is turned on when the voltage of the QB node is at a high level to supply the third low-potential gate voltage GVSS3 to the shared node of the first transistor T31 and the second transistor T32.

The first transistor T31 is turned on when the voltage of the QB node is at a high level to electrically connect the Q node and the QH node. Accordingly, if the first transistor T31 and the second transistor T32 are simultaneously turned on in response to the voltage of the QB node, the Q node and the QH node each are discharged or reset to the level of the third low-potential gate voltage GVSS3.

The inverter unit 508 changes the voltage level of the QB node according to the voltage level of the Q node. The inverter unit 508 includes first to fifth transistors T41 to T45.

The second transistor T42 and the third transistor T43 are connected between the second high-potential gate voltage line that transfers the second high-potential gate voltage GVDD2 and the third connection node NC3. The second transistor T42 and the third transistor T43 are connected in series with each other.

The second transistor T42 and the third transistor T43 supply the second high-potential gate voltage GVDD2 to the third connection node NC3 in response to the second high-potential gate voltage GVDD2. The second transistor T42 is turned on by the second high-potential gate voltage GVDD2 to supply the second high-potential gate voltage GVDD2 to the shared node of the second transistor T42 and the third transistor T43.

The third transistor T43 is turned on by the second high-potential gate voltage GVDD2 to electrically connect the shared node of the second transistor T42 and the third transistor T43 with the third connection node NC3. Accordingly, if the second transistor T42 and the third transistor T43 are simultaneously turned on by the second high-potential gate voltage GVDD2, the third connection node NC3 is charged to the level of the second high-potential gate voltage GVDD2.

The fourth transistor T44 is connected between the third connection node NC3 and the second low-potential gate voltage line that transfers the second low-potential gate voltage GVSS2.

The fourth transistor T44 supplies the second low-potential gate voltage GVSS2 to the third connection node NC3 in response to the voltage of the Q node. The fourth transistor T44 is turned on when the voltage of the Q node is at a high level to discharge or reset the third connection node NC3 to the second low-potential gate voltage GVSS2.

The first transistor T41 is connected between the second high-potential gate voltage line transferring the second high-potential gate voltage GVDD2 and the QB node.

The first transistor T41 supplies the second high-potential gate voltage GVDD2 to the QB node in response to the voltage of the third connection node NC3. The first transistor T41 is turned on when the voltage of the third connection node NC3 is at the high level to charge the QB node to the level of the second high-potential gate voltage GVDD2.

The fifth transistor T45 is connected between the QB node and the third low-potential gate voltage line that transfers the third low-potential gate voltage GVSS3.

The fifth transistor T45 supplies the third low-potential voltage GVSS3 to the QB node in response to the voltage of the Q node. The fifth transistor T45 is turned on when the voltage of the Q node is at the high level to discharge or reset the QB node to the third low-potential gate voltage GVSS3 level.

The QB node stabilization unit 510 discharges the QB node to the third low-potential gate voltage GVSS3 in response to the input of the subsequent carry signal C(k−2), the input of the reset signal RESET, and the charging voltage of the M node. The QB node stabilization unit 510 can include first to third transistors T51 to T53.

The first transistor T51 is connected between the QB node and the second low-potential gate voltage line that transfers the third low-potential gate voltage GVSS3.

The first transistor T51 supplies the third low-potential gate voltage GVSS3 to the QB node in response to the input of the subsequent carry signal C(k−2).

The second transistor T52 and the third transistor T53 are connected between the QB node and the third low-potential gate voltage line that transfers the third low-potential gate voltage GVSS3. The second transistor T52 and the third transistor T53 are connected in series with each other.

The second transistor T52 and the third transistor T53 discharge the QB node to the third low-potential gate voltage GVSS3 level in response to the input of the reset signal RESET and the charging voltage of the M node.

The third transistor T53 is turned on when the voltage at the M node is at a high level to supply the third low-potential gate voltage GVSS3 to the shared node of the second transistor T52 and the third transistor T53.

The second transistor T52 is turned on by the input of the reset signal RESET to electrically connect the shared node of the second transistor T52 and the third transistor T53 with the QB node. Accordingly, if the reset signal RESET is input while the voltage of the M node is at a high level, the second transistor T52 and the third transistor T53 are simultaneously turned on to discharge or reset the QB node to the third low-potential gate voltage GVSS2 level.

The carry signal output unit 512 outputs the carry signal C(k) based on the voltage level of the carry clock signal CRCLK(k) or the third low-potential gate voltage GVSS3 level according to the voltage level of the Q node or the voltage level of the QB node.

The carry signal output unit 512 includes a first transistor T61, a second transistor T62, and a boosting capacitor CC.

The first transistor T61 is connected between the clock signal line transferring the carry clock signal CRCLK(k) and the first output node NO1. The boosting capacitor CC is connected between the gate node and the source node of the first transistor T61.

The first transistor T61 outputs a high-level carry signal C(k) through the first output node NO1 based on the carry clock signal CRCLK(k) in response to the voltage of the Q node. The first transistor T61 is turned on when the voltage of the Q node is at the high level to supply the carry clock signal CRCLK(k) of the high level to the first output node NO1. Accordingly, a high-level carry signal C(k) is output.

When the carry signal C(k) is output, the boosting capacitor CC bootstraps the voltage of the Q node to a higher boosting voltage level than the first high-potential gate voltage GVDD1 in synchronization with the high-level carry clock signal CRCLK(k). If the voltage of the Q node is bootstrapped, the high-level carry clock signal CRCLK(k) can be output as the carry signal C(k) quickly and without distortion.

The second transistor T62 is connected between the first output node NO1 and the third low-potential gate voltage line that transfers the third low-potential gate voltage GVSS3.

The second transistor T62 outputs a low-level carry signal C(k) through the first output node NO1 based on the third low-potential gate voltage GVSS3 in response to the voltage of the QB node. The second transistor T62 is turned on when the voltage of the QB node is at a high level to supply the third low-potential voltage GVSS3 to the first output node NO1. Accordingly, a low-level carry signal C(k) is output.

The scan signal output unit 514 outputs a plurality of scan signals SCAN(i), SCAN(i+1), SCAN(i+2), and SCAN(i+3) based on the first low-potential gate voltage GVSS1 level or the voltage level of the plurality of scan clock signals SCCLK(i), SCCLK(i+1), SCCLK(i+2), and SCCLK(i+3) according to the voltage level of the Q node or the voltage level of the QB node (where i is a positive integer greater than zero).

The scan signal output unit 514 includes first to eighth transistors T71 to T78 and boosting capacitors CS1, CS2, CS3, and CS4.

The first transistor T71, the third transistor T73, the fifth transistor T75, and the seventh transistor T77 are connected between the clock signal lines transferring the scan clock signals SCCLK(i), SCCLK(i+1), SCCLK(i+2), and SCCLK(i+3) and the second to fifth output nodes NO2 to NO5.

The boosting capacitors CS1, CS2, CS3, and CS4 are connected between the gate nodes and the source nodes of the first transistor T71, the third transistor T73, the fifth transistor T75, and the seventh transistor T77.

The first transistor T71, the third transistor T73, the fifth transistor T75, and the seventh transistor T77, respectively, output the high-level scan signals SCAN(i), SCAN(i+1), SCAN(i+2), and SCAN(i+3) through the second output node NO2, the third output node NO3, the fourth output node N04, and the fifth output node NO5 based on the scan clock signals SCCLK(i), SCCLK(i+1), SCCLK(i+2), and SCCLK(i+3) in response to the voltage of the Q node.

The first transistor T71, the third transistor T73, the fifth transistor T75, and the seventh transistor T77 are turned on when the voltage of the Q node is at a high level, supplying the high-level scan clock signals SCCLK(i), SCCLK(i+1), SCCLK(i+2), and SCCLK(i+3) to the second output node NO2, the third output node NO3, the fourth output node N04, and the fifth output node N05, respectively. Accordingly, the high-level scan signals SCAN(i), SCAN(i+1), SCAN(i+2), and SCAN(i+3) each are output.

The first transistor T71, the third transistor T73, the fifth transistor T75, and the seventh transistor T77 each correspond to pull-up transistors.

When the scan signals SCAN(i), SCAN(i+1), SCAN(i+2), and SCAN(i+3) are output, the boosting capacitors CS1, CS2, CS3, and CS4 bootstrap or increase the voltage of the Q node to a higher boosting voltage level than the first high-potential gate voltage GVDD1 level in synchronization with the high-level scan clock signals SCCLK(i), SCCLK(i+1), SCCLK(i+2), and SCCLK(i+3). If the voltage of the Q node is bootstrapped, the high-level scan clock signals SCCLK(i), SCCLK(i+1), SCCLK(i+2), and SCCLK(i+3) can be output as the scan signals SCAN(i), SCAN(i+1), SCAN(i+2), and SCAN(i+3) quickly and without distortion.

The second transistor T72, the fourth transistor T74, the sixth transistor T76, and the eighth transistor T78, respectively, output the low-level scan signals SCAN(i), SCAN(i+1), SCAN(i+2), and SCAN(i+3) through the second output node NO2, the third output node NO3, the fourth output node N04, and the fifth output node NO5 based on the first low-potential gate voltage GVSS1 in response to the voltage of the QB node.

The second transistor T72, the fourth transistor T74, the sixth transistor T76, and the eighth transistor T78 are turned on when the voltage of the QB node is at a high level, supplying the first low-potential gate voltage GVSS1 to the second output node NO2, the third output node NO3, the fourth output node NO4, and the fifth output node N05, respectively. Accordingly, the low-level scan signals SCAN(i), SCAN(i+1), SCAN(i+2), and SCAN(i+3) are output.

The second transistor T72, the fourth transistor T74, the sixth transistor T76, and the eighth transistor T78 each correspond to pull-down transistors.

Described herein is an example in which three high-potential gate voltages GVDD1, GVDD2, and GVDD3 set to different levels and three low-potential gate voltages GVSS1, GVSS2, and GVSS3 set to different levels are supplied to each stage circuit. For example, the first high-potential gate voltage GVDD1, the second high-potential gate voltage GVDD2, and the third high-potential gate voltage GVDD3 can be set to 20V, 16V, and 14V, respectively, and the first low-potential gate voltage GVSS1, the second low-potential gate voltage GVSS2, and the third low-potential gate voltage GVSS3 can be set to −6V, −10V, and −12V, respectively. These values are merely examples, and the levels of the high-potential gate voltages and the low-potential gate voltages can be set to differ depending on embodiments.

Since the gate driving integrated circuit GDIC includes a plurality of transistors (e.g., each potentially having their own slightly different characteristic values), the degradation and lifespan of the gate driving integrated circuit GDIC can be determined by the most degraded transistor among them.

In general, in the gate driving integrated circuit GDIC, the stabilization of the Q node plays an important role, and therefore, it can be said that the stress applied to the transistors T31 and T32 constituting the Q node stabilization unit 506 is relatively large.

Accordingly, to extend the lifespan of the gate driving integrated circuit GDIC, a structure for sensing and compensating for degradation of the transistors T31 and T32 constituting the Q node stabilization unit 506 according to the driving time of the display device 100 is preferable.

Figure 8:
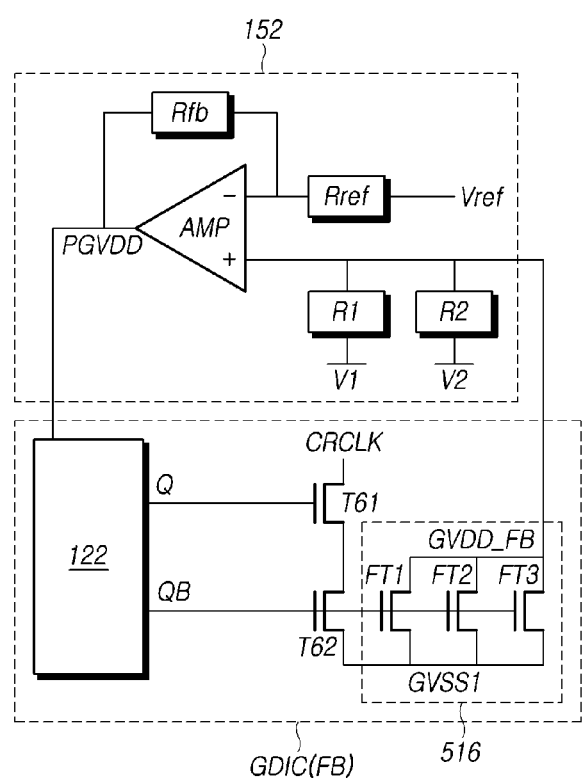
FIG. 8 is a view illustrating an example of a structure for compensating for degradation of a gate driving circuit in a display device according to embodiments of the disclosure.

FIG. 8 is a view illustrating an example of a structure for compensating for degradation of a gate driving circuit in a display device according to embodiments of the disclosure.

Referring to FIG. 8, in the display device 100 according to embodiments of the disclosure, a feedback circuit 516 can be included in at least one or more gate driving integrated circuit GDIC among the plurality of gate driving integrated circuits GDIC constituting the gate driving circuit 120.

Accordingly, the gate driving integrated circuit provided with the feedback circuit 516 can be denoted as a feedback gate driving integrated circuit GDIC(FB), and a gate driving integrated circuit that is not provided with the feedback circuit 516 can be denoted as a typical gate driving integrated circuit.

The feedback circuit 516 can include at least one or more feedback transistors FT1, FT2, and FT3 whose gate node is connected to the QB node. Shown here is an example in which the feedback circuit 516 includes three feedback transistors FT1, FT2, and FT3 and is connected to the rear end of the carry signal output unit 512 (the scan signal output unit 514 is omitted).

The gate nodes of the feedback transistors FT1, FT2 and FT3 are connected to the QB node of the feedback gate driving integrated circuit GDIC(FB), and the drain nodes of the feedback transistors FT1, FT2, and FT3 are connected to the first low-potential gate voltage GVSS1. The source nodes of the feedback transistors FT1, FT2, and FT3 are connected jointly and are connected to the feedback line.

Accordingly, the high-potential gate voltage compensation circuit 152 receives the feedback voltage GVDD_FB through the feedback circuit 516 configured in the feedback gate driving integrated circuit GDIC(FB) and generates a compensating high-potential gate voltage PGVDD to be applied to the plurality of gate driving integrated circuits GDIC. The compensating high-potential gate voltage PGVDD can be applied to both the feedback gate driving integrated circuit GDIC(FB) with the feedback circuit 516 and the gate driving integrated circuit GDIC without the feedback circuit 516.

The feedback voltage GVDD_FB can be the source node voltage of the feedback transistors FT1, FT2, and FT3.

In this situation, it is effective to supply the compensating high-potential gate voltage PGVDD generated by the high-potential gate voltage compensation circuit 152, as the second high-potential gate voltage GVDD2 corresponding to the driving voltages of the transistors T41, T42, T43, and T44 constituting the inverter unit 508 to reduce the gate-source voltage of the transistors T31 and T32 constituting the Q node stabilization unit 506, in order to reduce the stress on the transistors T31 and T32.

The high-potential gate voltage compensation circuit 152 can be positioned in the power management circuit 150.

The high-potential gate voltage compensation circuit 152 can include an amplifier AMP having a non-inverting input terminal (+) receiving a feedback voltage GVDD_FB, a reference resistor Rref connected to the inverting input terminal (−) of the amplifier AMP to transfer the reference voltage Vref, at least one setting resistor R1 and R2 connected to the non-inverting input terminal (+) of the amplifier AMP to transfer at least one setting voltage V1 and V2, and a feedback resistor Rfb connected between the inverting input terminal (—) and the output terminal of the amplifier AMP.

Accordingly, the high-potential gate voltage compensation circuit 152 can interwork with the feedback voltage GVDD_FB transferred from the feedback circuit 516 of the feedback gate driving integrated circuit GDIC(FB), controlling the level of the compensating high-potential gate voltage PGVDD applied to the plurality of gate driving integrated circuits GDIC.

In this situation, the values of the reference resistor Rref, the setting resistors R1 and R2, and the feedback resistor Rfb can be determined considering the level of the compensating high-potential gate voltage PGVDD controlled according to the feedback voltage GVDD_FB applied to the non-inverting input terminal (+).

Figure 9:
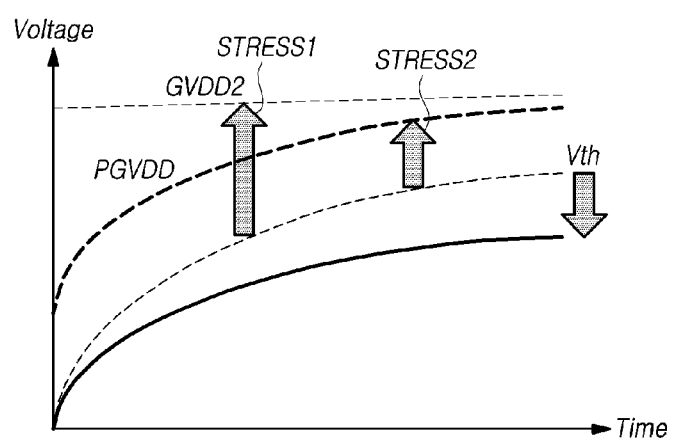
FIGS. 9 and 10 are views conceptually illustrating an effect of reducing degradation of a gate driving circuit through a process for compensating for a high-potential gate voltage applied to a gate driving circuit in a display device according to embodiments of the disclosure.
Figure 10:
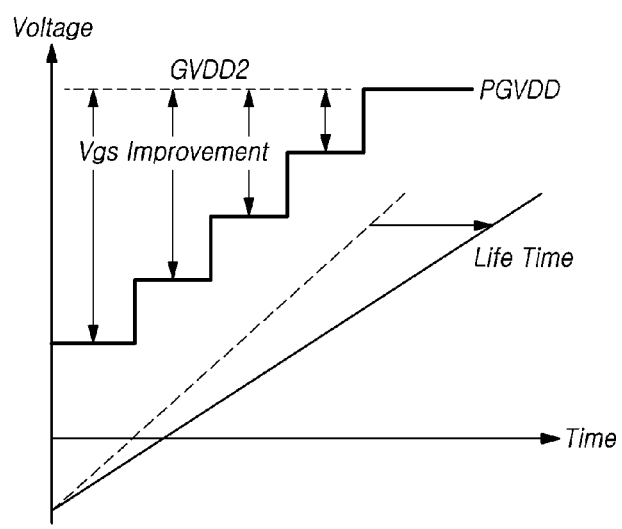

FIGS. 9 and 10 are views conceptually illustrating an effect of reducing degradation of a gate driving circuit through a process for compensating for a high-potential gate voltage applied to a gate driving circuit in a display device according to embodiments of the disclosure.

Referring to FIG. 9, as the driving time of the display device 100 according to embodiments of the disclosure increases, the threshold voltages Vth of the transistors T31 and T32 constituting the Q node stabilization unit 506 of the gate driving circuit 120 increase.

In this situation, the voltage corresponding to the difference between the high-potential gate voltage GVDD2 and the threshold voltage Vth becomes larger and acts as a stress in the transistors T31 and T32 constituting the Q node stabilization unit 506.

If the high-potential gate voltage GVDD2 applied to the gate driving circuit 120 is maintained at a constant level, the stress applied to the transistors T31 and T32 constituting the Q node stabilization unit 506 increases due to a large difference between the high-potential gate voltage GVDD2 and the threshold voltage Vth at the initial driving period of the display device 100 (STRESS1).

It is possible to relieve the stress of the transistors T31 and T32 constituting the Q node stabilization unit 506 by supplying a compensating high-potential gate voltage GVDD2 of a lower level than the high-potential gate voltage GVDD2 applied to the gate driving circuit 120 reflecting the feedback voltage GVDD_FB supplied through the feedback circuit 516 configured in the gate driving circuit 120 (STRESS2).

As a result, it is possible to reduce the degradation rate of the transistors T31 and T32 constituting the Q node stabilization unit 506 and increase the lifespan of the gate driving circuit 120.

FIG. 10 is a graph experimentally illustrating a result of extending the lifespan of the gate driving circuit 120 by supplying a compensating high-potential gate voltage PGVDD of a lower level than the high-potential gate voltage GVDD2 applied to the gate driving circuit 120 reflecting the feedback voltage GVDD_FB supplied through the feedback circuit 516 configured in the gate driving circuit 120.

Although the high-potential gate voltage compensation circuit 152 can generate the compensating high-potential gate voltage PGVDD to linearly correspond to the feedback voltage GVDD_FB supplied through the feedback circuit 516 configured in the gate driving circuit 120, it is also possible to stepwise change the level of the compensating high-potential gate voltage PGVDD using a scaler.

Figure 11:
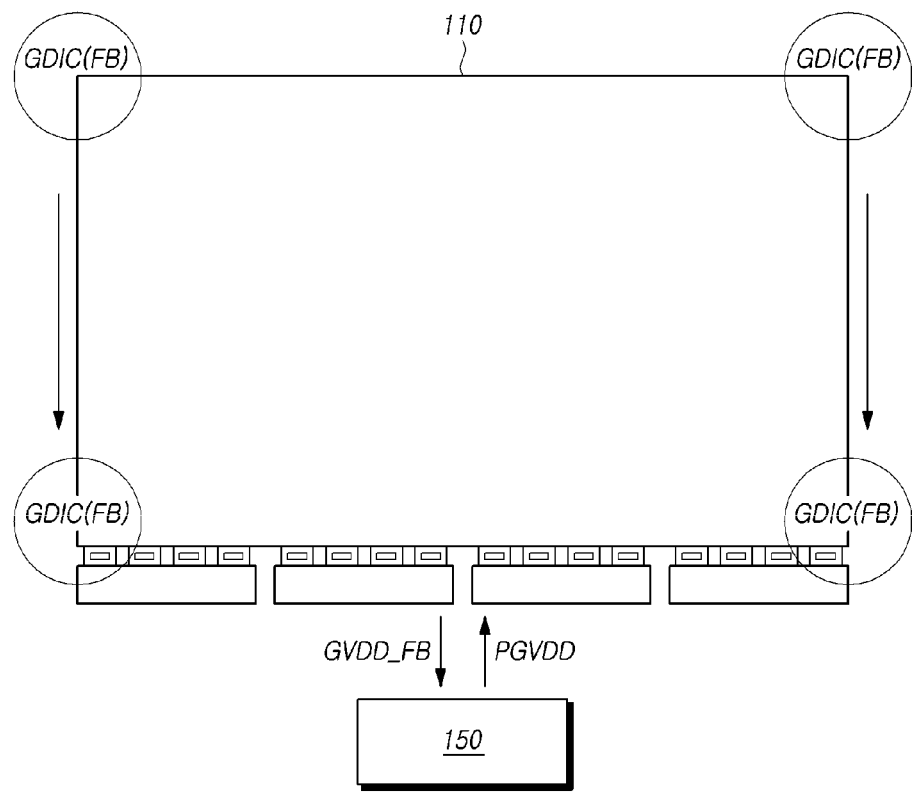
FIG. 11 is a view illustrating an example of disposing a gate driving integrated circuit including a feedback circuit in a display device according to embodiments of the disclosure.

FIG. 11 is a view illustrating an example of disposing a gate driving integrated circuit including a feedback circuit in a display device according to embodiments of the disclosure.

Referring to FIG. 11, in the display device 100 according to embodiments of the disclosure, a feedback gate driving integrated circuit GDIC(FB) having a feedback circuit 516 embedded therein can be disposed in a partial area of the display panel 110.

For example, feedback gate driving integrated circuits GDIC(FB) can be positioned in upper/lower/left/right corners of the display panel 110 to compensate for degradation distribution of the display panel 110.

In this situation, it is possible to determine the degradation state of the gate driving integrated circuit GDIC according to the position of the display panel 110 by receiving the feedback voltages GVDD_FB from the feedback gate driving integrated circuits GDIC(FB) disposed in the upper/lower/left/right corners of the display panel 110.

As a result, it is possible to detect the degradation state of the gate driving integrated circuit GDIC according to various positions within the display panel 110 and to generate the compensating high-potential gate voltage PGVDD reflecting the degradation state according to the corresponding position in the display panel 110.

The display device 100 of the disclosure can also identify whether the feedback circuit 516 embedded in the feedback gate driving integrated circuit GDIC(FB) has a defect using the compensating high-potential gate voltage PGVDD.

Figure 12:
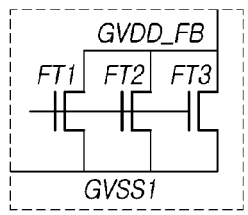
FIG. 12 is a diagram illustrating an example of a defective state of a feedback circuit embedded in a gate driving integrated circuit in a display device according to embodiments of the disclosure.

FIG. 12 is a diagram illustrating an example of a feedback circuit embedded in a gate driving integrated circuit and a defective state in a display device according to embodiments of the disclosure.

Referring to FIG. 12, in the display device 100 according to embodiments of the disclosure, the feedback circuit 516 built into the feedback gate driving integrated circuit GDIC (FB) can cause various defects in the connection line.

For example, a situation where the gate node and source node of the third feedback transistor FT3 in the last stage among the feedback transistors FT1, FT2, and FT3 constituting the feedback circuit 516 are shorted (Case 1), a situation where the gate node and drain node of the third feedback transistor FT3 are shorted (Case 2), a situation where the drain node and source node of the third feedback transistor FT3 are shorted, or a situation where the feedback line is open (Case 4) can occur.

When the gate node and source node of the third feedback transistor FT3 are shorted (Case 1), the third feedback transistor FT3 is turned off. In this situation, an error occurs in the feedback voltage GVDD_FB, and the compensating high-potential gate voltage PGVDD is not normally generated, causing a defect in the horizontal line defect in the display panel 110.

When the gate node and drain node of the third feedback transistor FT3 are shorted (Case 2), the third feedback transistor FT3 are also turned off. As a result, an error occurs in the feedback voltage GVDD_FB, and the compensating high-potential gate voltage PGVDD is not normally generated, causing a defect in the horizontal line defect in the display panel 110.

When the drain node and source node of the third feedback transistor FT3 are shorted (Case 3), the third feedback transistor FT3 stays in the turned-on state. Accordingly, the feedback voltage GVDD_FB is normally generated, but degradation due to the feedback circuit 516 rapidly progresses, accelerating a defect in the feedback gate driving integrated circuit GDIC(FB). In this situation, this type of error in the gate driving circuit 120 leads to a defect in the display panel 110.

When the feedback line extending from the source node of the third feedback transistor FT3 is open (Case 4), the third feedback transistor FT3 stays in the turned-off state. Accordingly, the feedback voltage GVDD_FB is not transferred to the high-potential gate voltage compensation circuit 152, so that the compensating high-potential gate voltage PGVDD maintains the same level (e.g., compensation cannot be properly performed). As a result, it can be impossible to achieve a reduction in the degradation of the gate driving circuit 120 by the high-potential gate voltage GVDD.

Accordingly, it is desirable to detect an error in the feedback circuit 516 embedded in the feedback gate driving integrated circuit GDIC(FB) and, when an error occurs, control the compensating high-potential gate voltage PGVDD by displaying or reflecting the error.

A circuit for sensing the characteristic value of the driving transistor DRT constituting the subpixel SP can be used to detect an error in the feedback circuit 516 embedded in the feedback gate driving integrated circuit GDIC(FB). For example, the circuit for sensing the characteristic value of the driving transistor DRT constituting the subpixel SP can be repurposed to carry out an additional function of detecting errors in the feedback circuit 516.

Figure 13:
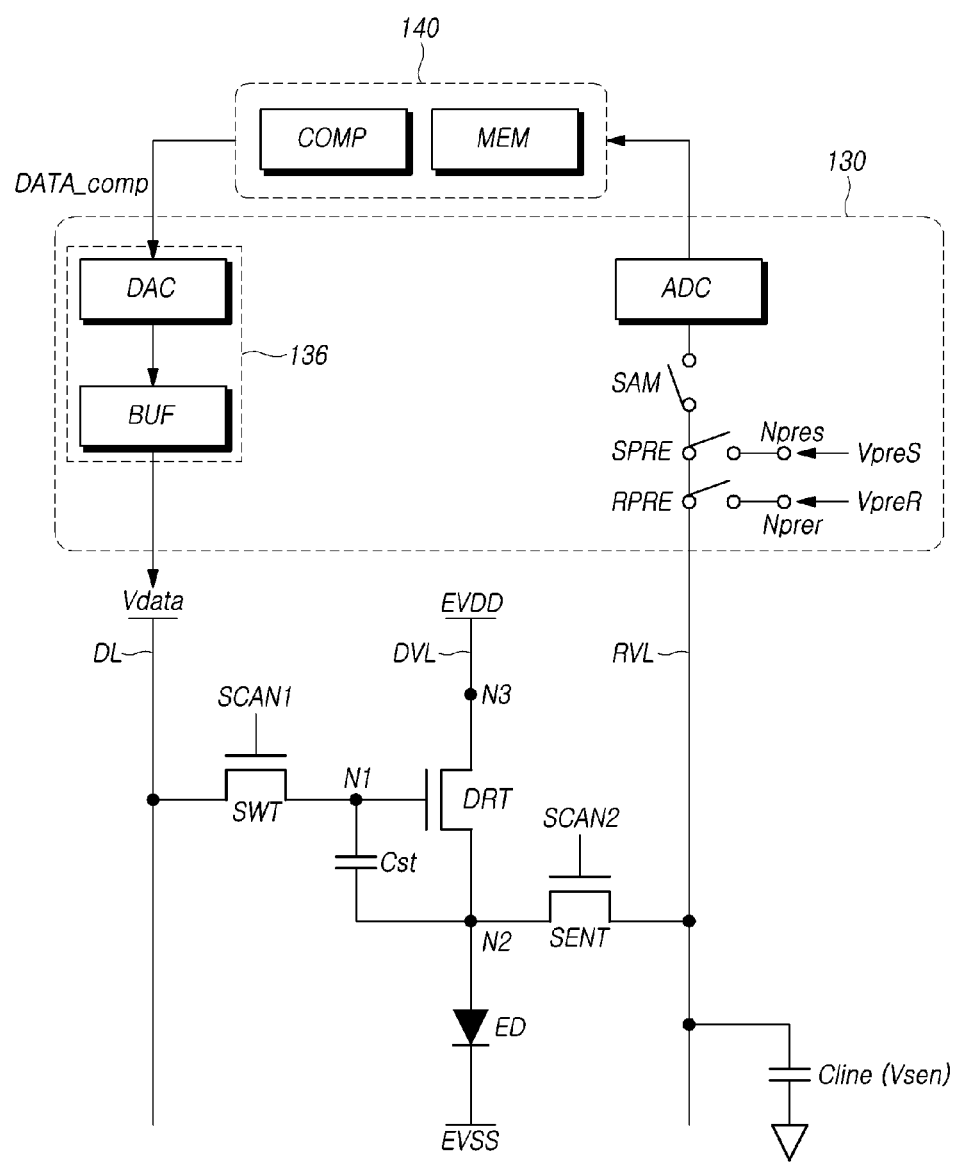
FIG. 13 is a view illustrating an example circuit structure of sensing a characteristic value of a driving transistor in a display device according to embodiments of the disclosure.

FIG. 13 is a view illustrating an example circuit structure of sensing a characteristic value of a driving transistor in a display device according to embodiments of the disclosure.

Referring to FIG. 13, a display device 100 according to embodiments of the disclosure can include components for compensating for a deviation in the characteristic value of the driving transistor DRT.

For example, in the sensing period of the display device 100, the characteristic value or a change in the characteristic value of the driving transistor DRT can be applied as the voltage (e.g., Vdata−Vth) of the second node N2 of the driving transistor DRT.

The voltage of the second node N2 of the driving transistor DRT can correspond to the voltage of the reference voltage line RVL when the sensing transistor SENT is in the turned-on state. The line capacitor Cline on the reference voltage line RVL can be charged by the voltage of the second node N2 of the driving transistor DRT. The reference voltage line RVL can have a voltage corresponding to the voltage of the second node N2 of the driving transistor DRT due to the sensing voltage Vsen charged to the line capacitor Cline.

The display device 100 can include an analog-to-digital converter ADC that senses the voltage of the reference voltage line RVL corresponding to the voltage of the second node N2 of the driving transistor DRT and converts the voltage into digital data and a switch circuit SAM and SPRE for sensing the characteristic value of the driving transistor DRT.

The switch circuit SAM and SPRE for controlling the sensing driving can include a characteristic value sensing switch SPRE for controlling the connection between each reference voltage line RVL and the sensing node Npres to which the reference voltage is supplied and a sampling switch SAM for controlling the connection between each reference voltage line RVL and the analog-to-digital converter ADC.

The characteristic value sensing switch SPRE is a switch for controlling sensing driving operation, and the reference voltage supplied to the reference voltage line RVL by the characteristic value sensing switch SPRE becomes the sensing reference voltage VpreS.

The switch circuit for sensing the characteristic value of the driving transistor DRT can include a display driving switch RPRE for controlling the display driving operation. The display driving switch RPRE can control the connection between each reference voltage line RVL and the display driving reference voltage node Nprer to which the reference voltage is supplied.

The display driving switch RPRE is a switch used for the display driving operation, and the reference voltage supplied to the reference voltage line RVL by the display driving switch RPRE corresponds to the display driving reference voltage VpreR.

In this situation, the characteristic value sensing switch SPRE and the display driving switch RPRE can be separately provided or can be integrated into a single one. The sensing reference voltage VpreS and the display driving reference voltage VpreR can have the same voltage value or different voltage values.

The timing controller 140 of the display device 100 can include a memory MEM for storing the data transferred from the analog-to-digital converter ADC or previously storing a reference value and a compensation circuit COMP that compares the reference value stored in the memory MEM and the received data and compensates for the deviation in the characteristic value. In this situation, the compensation value calculated by the compensation circuit COMP can be stored in the memory MEM.

Accordingly, the timing controller 140 can compensate for the digital image data DATA to be supplied to the data driving circuit 130 by using the compensation value calculated by the compensation circuit COMP and can output the compensated digital image data DATA_comp to the data driving circuit 130.

Accordingly, the data driving circuit 130 can convert the compensated digital image data DATA_comp into an analog signal type of data voltage Vdata through a digital-to-analog converter DAC and output the converted data voltage Vdata to the data line DL through an output buffer BUF. As a result, the deviation in the characteristic value (e.g., deviation in threshold voltage deviation or deviation in mobility) for the driving transistor DRT in the corresponding subpixel SP can be compensated.

The data driving circuit 130 can include a data voltage output circuit 136 including a latch circuit, a digital-to-analog converter DAC, and an output buffer BUF and, in some situations, the data driving circuit 130 can further include an analog-to-digital converter ADC and various switches SAM, SPRE, and RPRE. Alternatively, the analog-to-digital converter ADC and various switches SAM, SPRE, and RPRE can be positioned outside the data driving circuit 130.

The compensation circuit COMP can be present inside or outside the timing controller 140. The memory MEM can be positioned outside the timing controller 140 or can be implemented, in the form of a register, inside the timing controller 140.

The display device 100 of the disclosure can detect an error in the feedback circuit 516 embedded in the feedback gate driving integrated circuit GDIC(FB) using a circuit sensing the characteristic value of the driving transistor DRT.

Figure 14:
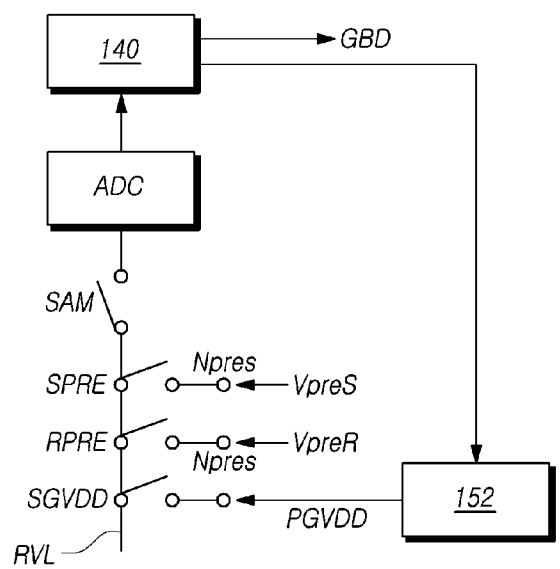
FIG. 14 is a view illustrating an example of a configuration of detecting an error in a feedback circuit embedded in a feedback gate driving integrated circuit in a display device according to embodiments of the disclosure.

FIG. 14 is a view illustrating an example of a configuration of detecting an error in a feedback circuit embedded in a feedback gate driving integrated circuit in a display device according to embodiments of the disclosure.

Referring to FIG. 14, in the display device 100 according to embodiments of the disclosure, the data driving circuit 130 can include a data voltage output circuit 136 including a latch circuit, a digital-to-analog converter DAC, and an output buffer BUF and, in some situations, the data driving circuit 130 can further include an analog-to-digital converter ADC and various switches SAM, SPRE, RPRE, and SGVDD. The analog-to-digital converter ADC and various switches SAM, SPRE, RPRE, and SGVDD can be positioned outside the data driving circuit 130.

The switch circuits SAM, SPRE, and SGVDD for controlling sensing driving can include a characteristic value sensing switch SPRE for connecting connection between the reference voltage line RVL corresponding to the sensing line for detecting the characteristic value of the driving transistor DRT and the sensing reference voltage node Npres to which the sensing reference voltage VpreS is supplied, a gate sensing switch SGVDD for controlling the transfer path of the compensating high-potential gate voltage PGVDD supplied from the high-potential gate voltage compensation circuit 152, and a sampling switch SAM for controlling connection between analog-to-digital converters ADC.

The characteristic value sensing switch SPRE is a switch for controlling the characteristic value sensing of the driving transistor DRT, and the reference voltage supplied to the reference voltage line RVL by the characteristic value sensing switch SPRE becomes the sensing reference voltage VpreS.

The gate sensing switch SGVDD is a switch for controlling the sensing of the compensating high-potential gate voltage PGVDD transferred from the high-potential gate voltage compensation circuit 152, and the compensating high-potential gate voltage PGVDD is applied to the reference voltage line RVL by the operation of the gate sensing switch SGVDD.

If the sampling switch SAM is turned on while the gate sensing switch SGVDD is turned on, the timing controller 140 can detect the compensating high-potential gate voltage PGVDD supplied to the reference voltage line RVL. In this way, the sensing circuit can switch between sensing the characteristic value of the driving transistor DRT and sensing the compensating high-potential gate voltage PGVDD.

The switch circuit for sensing the characteristic value of the driving transistor DRT can include a display driving switch RPRE for controlling the display driving operation. The display driving switch RPRE can control the connection between each reference voltage line RVL and the display driving reference voltage node Nprer to which the reference voltage is supplied.

The display driving switch RPRE is a switch used for the display driving operation, and the reference voltage supplied to the reference voltage line RVL by the display driving switch RPRE corresponds to the display driving reference voltage VpreR.

The timing controller 140 can determine whether the feedback gate driving integrated circuit GDIC(FB) has an error depending on the level, or a change in the level, of the compensating high-potential gate voltage PGVDD and, upon determining that an error occurs in the feedback gate driving integrated circuit GDIC(FB), output a gate error signal GBD or control the high-potential gate voltage compensation circuit 152 to change the level of the compensating high-potential gate voltage PGVDD.

Thus, the display device 100 of the disclosure can effectively determine an error in the gate driving circuit 120 by detecting a change in the level of the compensating high-potential gate voltage PGVDD through the gate sensing switch SGVDD formed on the reference voltage line RVL of the data driving circuit 130 while simultaneously controlling the level of the compensating high-potential gate voltage PGVDD reflecting the feedback voltage GVDD_FB of the feedback circuit 516 disposed at the output end of the feedback gate driving circuit GDIC(FB).

Further, in the display device 100 of the disclosure, the power management circuit 150 can selectively supply the compensating high-potential gate voltage PGVDD and the display driving reference voltage VpreR according to the timing.

Figure 15:
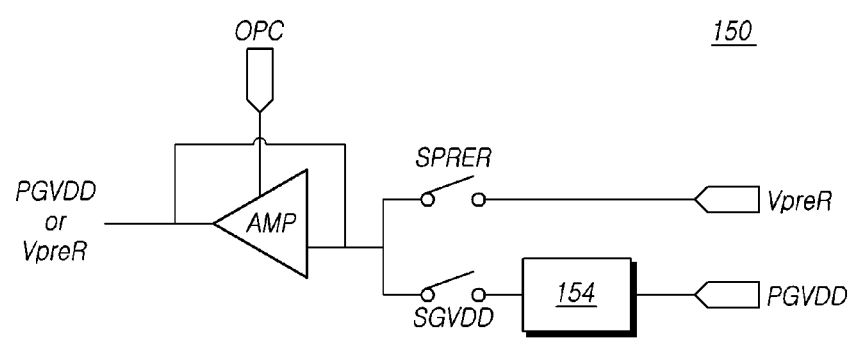
FIG. 15 is a view illustrating an example of a power management circuit for selectively supplying a compensating high-potential gate voltage and a display driving reference voltage in a display device according to embodiments of the disclosure.

FIG. 15 is a view illustrating an example of a power management circuit for selectively supplying a compensating high-potential gate voltage and a display driving reference voltage in a display device according to embodiments of the disclosure.

Referring to FIG. 15, in the display device 100 according to embodiments of the disclosure, the power management circuit 150 can include an amplifier Amp and switches SPRER and SGVDD for selectively supplying the compensating high-potential gate voltage PGVDD and the display driving reference voltage VpreR according to the timing.

In this situation, since the display driving reference voltage VpreR can differ from the compensating high-potential gate voltage PGVDD generated by the high-potential gate voltage compensation circuit 152, a scaler 154 can be included to adjust the compensating high-potential gate voltage PGVDD to a level similar to the display driving reference voltage VpreR.

The display sensing switch SPRER is a switch for controlling the time of supplying the display driving reference voltage VpreR to the amplifier Amp, and the gate sensing switch SGVDD is a switch for controlling the time of supplying the compensating high-potential gate voltage PGVDD transferred from the high-potential gate voltage compensation circuit 152 to the amplifier Amp.

Therefore, the display driving reference voltage VpreR or the compensating high-potential gate voltage PGVDD can be applied to the reference voltage line RVL through the amplifier Amp by the operation of the display sensing switch SPRER and the gate sensing switch SGVDD. In this way, the sensing circuit for the subpixel can switch between sensing the characteristic value of the driving transistor DRT and sensing the compensating high-potential gate voltage PGVDD.

The on/off operation of the amplifier Amp can be controlled by the amplifier control signal OPC.

As such, when the power management circuit 150 selectively supplies the compensating high-potential gate voltage PGVDD and the display driving reference voltage VpreR according to the timing, it may not be needed to dispose the gate sensing switch SGVDD for controlling the compensating high-potential gate voltage PGVDD in the data driving circuit 130.

To minimize the deviation of the analog-to-digital converter ADC, the display device 100 of the disclosure can sense the compensating high-potential gate voltage PGVDD and the characteristic value through a dummy channel, thereby reducing the offset noise of the analog-to-digital converter ADC.

Figure 16:
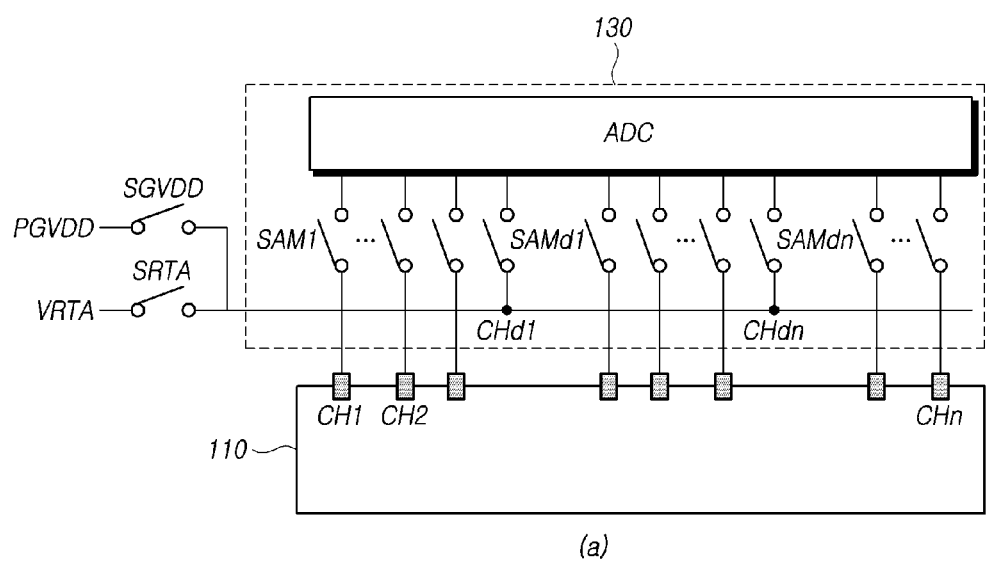
FIG. 16, including parts (a) and (b), is a view illustrating an example of a structure in which a sensing channel and a dummy channel are arranged in a display device according to embodiments of the disclosure.
Figure 16:
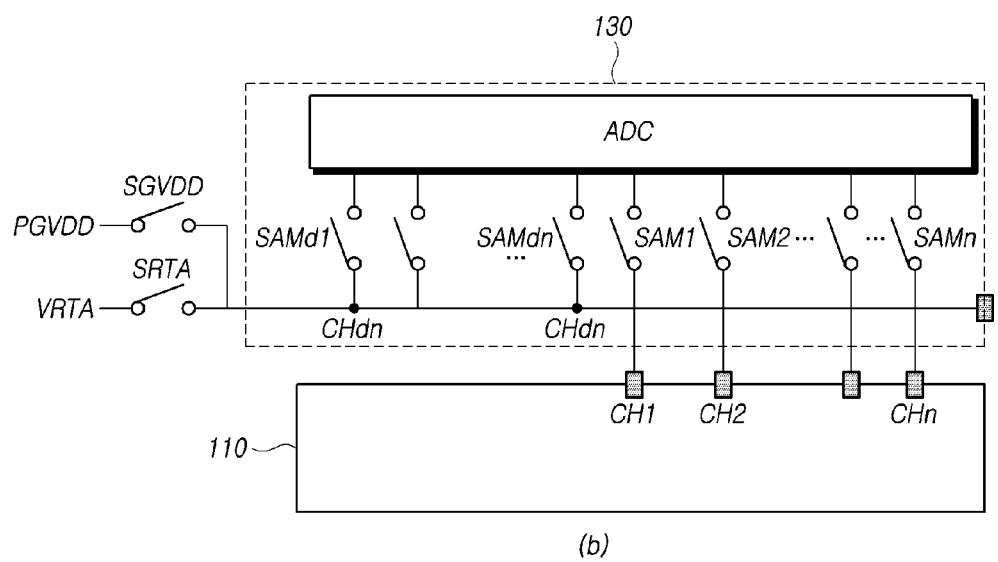

FIG. 16 is a view illustrating an example of a structure in which a sensing channel and a dummy channel are arranged in a display device according to embodiments of the disclosure.

Referring to FIG. 16, the display device 100 according to embodiments of the disclosure can supply the compensating high-potential gate voltage PGVDD or a dummy reference voltage VRTA through dummy channels CHd1 to CHdn under the control of the gate sensing switch SGVDD and the dummy sensing switch SRTA.

One or more dummy channels CHd1 to CHdn to which the compensating high-potential gate voltage PGVDD or the dummy reference voltage VRTA is supplied can be disposed between the sensing channels CH1 to CHn connected to the subpixels constituting the display panel 110 ((a) of FIG. 16), or can be disposed in a row on the left or right side of the sensing channels CH1 to CHn ((b) of FIG. 16).

The sensing channels CH1 to CHn are connected to the sensing lines corresponding to the subpixels through the sampling switches SAM1 to SAMn, respectively, to be able to detect the compensating high-potential gate voltage PGVDD or sensing voltage reflecting the characteristic value (threshold voltage or mobility) of the subpixels SP.

Accordingly, the dummy channels CHd1 to CHdn can receive the dummy reference voltage VRTA or the compensating high-potential gate voltage PGVDD through the dummy sampling switches SAMd1 to SAMdn to compensate for the gain or offset of the analog-to-digital converter ADC.

The foregoing embodiments are briefly described below.

A display device 100 of the disclosure can comprise a display panel 110 having a plurality of subpixels SP, a gate driving circuit 120 configured to supply a plurality of scan signals SCAN to the display panel 110 through a plurality of gate lines GL, a data driving circuit 130 configured to supply a plurality of data voltages Vdata to the display panel 110 through a plurality of data lines DL, a power management circuit 150 configured to supply a plurality of driving voltages to the gate driving circuit 120 and the data driving circuit 130 and supply a compensating high-potential gate voltage PGVDD to the gate driving circuit 120 based on a feedback voltage GVDD_FB transferred from the gate driving circuit 120, and a timing controller 140 configured to control the gate driving circuit 120, the data driving circuit 130, and the power management circuit 150.

The gate driving circuit 120 can include a plurality of gate driving integrated circuits GDIC. At least one of the plurality of gate driving integrated circuits GDIC can be configured as a feedback gate driving integrated circuit GDIC(FB) including a feedback circuit 516.

The feedback gate driving integrated circuit GDIC(FB) can be disposed in one or more corners of the display panel 110.

The gate driving integrated circuit GDIC can include a line selection unit 502 configured to charge an M node based on a previous carry signal C(k−2) in response to an input of a line sensing preparation signal LSP, a Q node control unit 504 configured to charge a Q node to a level of a first high-potential gate voltage GVDD1 in response to the previous carry signal C(k−2) and discharge the Q node to a level of a third low-potential gate voltage GVSS3 in response to an input of a subsequent carry signal C(k+2), a Q node stabilization unit 506 configured to discharge the Q node and a QH node to the level of the third low-potential gate voltage GVSS3 in response to a voltage of the QB node, an inverter unit 508 configured to change a voltage level of the QB node according to a voltage level of the Q node, a QB node stabilization unit 510 configured to discharge the QB node to the level of the third low-potential gate voltage GVSS3 in response to the subsequent carry signal C(k+2), a reset signal RESET, and the charging voltage of the M node, a carry signal output unit 512 configured to output a carry signal C(k) based on a voltage level of a carry clock signal CRCLK(k) or the level of the third low-potential gate voltage GVSS3 according to the voltage level of the Q node or the voltage level of the QB node, and a scan signal output unit 514 configured to output a plurality of scan signals SCAN based on voltage levels of a plurality of scan clock signals SCCLK(i), SCCLK(i+1), SCCLK(i+2), and SCCLK(i+3) or a level of a first low-potential gate voltage GVSS1 according to the voltage level of the Q node or the voltage level of the QB node.

The compensating high-potential gate voltage PGVDD can correspond to a second high-potential gate voltage GVDD2 driving the inverter unit 508.

The feedback circuit 516 can include at least one feedback transistor FT1, FT2, and FT3 having a gate node connected to the QB node, a drain node connected to the first low-potential gate voltage GVSS1, and a source node connected to a feedback line where the feedback voltage GVDD_FB is transferred.

The power management circuit 150 can include a high-potential gate voltage compensation circuit 152 configured to supply the compensating high-potential gate voltage PGVDD to the plurality of gate driving integrated circuits GDIC using the feedback voltage GVDD_FB transferred through the feedback circuit 516.

The high-potential gate voltage compensation circuit 152 can include an amplifier AMP having a non-inverting input terminal (+) to which the feedback voltage GVDD_FB is applied, a reference resistor Rref connected to an inverting input terminal (−) of the amplifier to transfer a reference voltage, at least one setting resistor V1 and V2 connected to the non-inverting input terminal (+) of the amplifier AMP to transfer at least one setting voltage, and a feedback resistor Rfb connected between the inverting input terminal (−) and an output terminal of the amplifier AMP.

The high-potential gate voltage compensation circuit 152 can further include a scaler changing a level of the compensating high-potential gate voltage PGVDD.

The data driving circuit 130 can include an analog-to-digital converter ADC sensing a voltage of a sensing line and converting the voltage into digital data, a characteristic value sensing switch SPRE controlling a connection between the sensing line and a node to which a sensing reference voltage VpreS is supplied, a gate sensing switch SGVDD controlling a connection between the sensing line and a node to which the compensating high-potential gate voltage PGVDD is supplied, and a sampling switch SAM controlling a connection between the sensing line and the analog-to-digital converter ADC.

The sensing line can be connected to a dummy channel CHd to which a dummy reference voltage VRTA is applied. The characteristic value sensing switch SPRE can control a connection between the dummy channel CHd and a node to which the dummy reference voltage VRTA is supplied. The gate sensing switch SGVDD can control a connection between the dummy channel CHd and the node to which the compensating high-potential gate voltage PGVDD is supplied.

A gate driving circuit 120 according to embodiments of the disclosure, configured to supply a plurality of scan signals SCAN through a plurality of gate lines GL to a display panel 110 having a plurality of subpixels SP can comprise a plurality of gate driving integrated circuits GDIC. At least one of the plurality of gate driving integrated circuits GDIC can be configured as a feedback gate driving integrated circuit GDIC(FB) including a feedback circuit 516 and be configured to receive a compensating high-potential gate voltage PGVDD generated by a power management circuit 150 using a feedback voltage GVDD_FB generated by the feedback circuit 516.

A power management circuit 150 according to embodiments of the disclosure, supplying a driving voltage to a gate driving circuit 120 supplying a plurality of scan signals SCAN to a display panel 110 through a plurality of gate lines GL, can comprise a high-potential gate voltage compensation circuit 152 configured to supply a compensating high-potential gate voltage PGVDD to the gate driving circuit 120 based on a feedback voltage GVDD_FB transferred from the gate driving circuit 120.

A data driving circuit 130 according to embodiments of the disclosure, supplying a plurality of data voltages Vdata to a display panel 110 through a plurality of data lines DL, can comprise an analog-to-digital converter ADC sensing a voltage of a sensing line and converting the voltage into digital data, a characteristic value sensing switch SPRE controlling a connection between the sensing line and a node to which a sensing reference voltage is supplied, a gate sensing switch SGVDD controlling a connection between the sensing line and a node to which a compensating high-potential gate voltage PGVDD transferred from a power management circuit 150 is supplied, and a sampling switch SAM controlling a connection between the sensing line and the analog-to-digital converter ADC.

The above description has been presented to enable a person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide examples of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device, comprising:
   a display panel having a plurality of subpixels;
   a gate driving circuit configured to supply a plurality of scan signals to the display panel through a plurality of gate lines, and output a feedback voltage;
   a data driving circuit configured to supply a plurality of data voltages to the display panel through a plurality of data lines;
   a power management circuit configured to:
      supply a plurality of driving voltages to the gate driving circuit and the data driving circuit, and
      supply a compensating high-potential gate voltage to the gate driving circuit based on the feedback voltage transferred from the gate driving circuit; and
   a timing controller configured to control the gate driving circuit, the data driving circuit, and the power management circuit,
   wherein the power management circuit includes:
      a gate sensing switch configured to control a connection between nodes to which the compensating high-potential gate voltage is supplied;
      a display sensing switch configured to control a connection between nodes to which a display driving reference voltage is supplied; and
      an amplifier configured to supply the compensating high-potential gate voltage or the display driving reference voltage to the data driving circuit according to a control of the gate sensing switch and the display sensing switch.

2. The display device of claim 1, wherein the gate driving circuit includes a plurality of gate driving integrated circuits, and
wherein at least one of the plurality of gate driving integrated circuits is configured as a feedback gate driving integrated circuit including a feedback circuit for outputting the feedback voltage.

3. The display device of claim 2, wherein the feedback gate driving integrated circuit is disposed in a corner of the display panel.

4. The display device of claim 2, wherein the feedback gate driving integrated circuit includes:
a Q node stabilization unit comprising a first transistor and a second transistor, and a QB node connecting a first gate of the first transistor to a second gate of the second transistor,
wherein the feedback circuit is connected to an output of the QB node.

5. The display device of claim 4, wherein the feedback circuit includes:
at least two feedback transistors having gates connected jointly to the output of the QB node and source nodes connected jointly to a feedback line for transferring the feedback voltage.

6. The display device of claim 2, wherein the gate driving integrated circuit includes:
a line selection unit configured to charge an M node based on a previous carry signal in response to an input of a line sensing preparation signal;
a Q node control unit configured to charge a Q node to a level of a first high-potential gate voltage in response to the previous carry signal and discharge the Q node to a level of a third low-potential gate voltage in response to an input of a subsequent carry signal;
a Q node stabilization unit configured to discharge the Q node and a QH node to the level of the third low-potential gate voltage in response to a voltage of a QB node;
an inverter unit configured to change a voltage level of the QB node according to a voltage level of the Q node;
a QB node stabilization unit configured to discharge the QB node to the level of the third low-potential gate voltage in response to the subsequent carry signal, a reset signal, and the charging voltage of the M node;
a carry signal output unit configured to output a current carry signal based on a voltage level of a carry clock signal or the level of the third low-potential gate voltage according to the voltage level of the Q node or the voltage level of the QB node; and
a scan signal output unit configured to output a plurality of scan signals based on voltage levels of a plurality of scan clock signals or a level of a first low-potential gate voltage according to the voltage level of the Q node or the voltage level of the QB node.

7. The display device of claim 6, wherein the compensating high-potential gate voltage corresponds to a second high-potential gate voltage driving the inverter unit.

8. The display device of claim 6, wherein the feedback circuit includes at least one feedback transistor having a gate node connected to the QB node, a drain node connected to a node for supplying the first low-potential gate voltage, and a source node connected to a feedback line for transferring the feedback voltage.

9. The display device of claim 2, wherein the power management circuit includes a high-potential gate voltage compensation circuit configured to supply the compensating high-potential gate voltage to the plurality of gate driving integrated circuits based on the feedback voltage output by the feedback circuit.

10. The display device of claim 9, wherein the high-potential gate voltage compensation circuit includes:
an amplifier having a non-inverting input terminal to which the feedback voltage is applied;
a reference resistor connected to an inverting input terminal of the amplifier to transfer a reference voltage;
at least one setting resistor connected to the non-inverting input terminal of the amplifier to transfer at least one setting voltage; and
a feedback resistor connected between the inverting input terminal and an output terminal of the amplifier.

11. The display device of claim 9, wherein the high-potential gate voltage compensation circuit further includes a scaler configured to change a level of the compensating high-potential gate voltage.

12. The display device of claim 2, wherein the data driving circuit includes:
an analog-to-digital converter configured to sense a voltage of a sensing line and convert the voltage into digital data;
a characteristic value sensing switch configured to control a connection between the sensing line and a node to which a sensing reference voltage is supplied;
a gate sensing switch configured to control a connection between the sensing line and a node to which the compensating high-potential gate voltage is supplied; and
a sampling switch configured to control a connection between the sensing line and the analog-to-digital converter.

13. The display device of claim 12, wherein the sensing line is connected to a dummy channel to which a dummy reference voltage is supplied,
wherein the characteristic value sensing switch is configured to control a connection between the dummy channel and a node to which the dummy reference voltage is supplied, and
wherein the gate sensing switch is configured to control a connection between the dummy channel and the node to which the compensating high-potential gate voltage is supplied.

14. The display device of claim 1, wherein the timing controller is configured to determine an error in the gate driving circuit based on the compensating high-potential gate voltage and output a gate error signal or control the high-potential gate voltage.

15. A gate driving circuit configured to supply a plurality of scan signals through a plurality of gate lines to a display panel having a plurality of subpixels, the gate driving circuit comprising:
a plurality of gate driving integrated circuits,
wherein at least one of the plurality of gate driving integrated circuits is configured as a feedback gate driving integrated circuit including a feedback circuit and is configured to receive a compensating high-potential gate voltage generated based on a feedback voltage generated by the feedback circuit,
wherein the gate driving integrated circuit includes:
a line selection unit configured to charge an M node based on a previous carry signal in response to an input of a line sensing preparation signal;

a Q node control unit configured to charge a Q node to a level of a first high-potential gate voltage in response to the previous carry signal and discharge the Q node to a level of a third low-potential gate voltage in response to an input of a subsequent carry signal;

a Q node stabilization unit configured to discharge the Q node and a QH node to the level of the third low-potential gate voltage in response to a voltage of a QB node;

an inverter unit configured to change a voltage level of the QB node according to a voltage level of the Q node;

a QB node stabilization unit configured to discharge the QB node to the level of the third low-potential gate voltage in response to the subsequent carry signal, a reset signal, and the charging voltage of the M node;

a carry signal output unit configured to output a current carry signal based on a voltage level of a carry clock signal or the level of the third low-potential gate voltage according to the voltage level of the Q node or the voltage level of the QB node; and a scan signal output unit configured to output a plurality of scan signals based on voltage levels of a plurality of scan clock signals or a level of a first low-potential gate voltage according to the voltage level of the Q node or the voltage level of the QB node.

16. The gate driving circuit of claim 15, wherein the feedback gate driving integrated circuit includes:
a Q node stabilization unit comprising a first transistor and a second transistor, and a QB node connecting a first gate of the first transistor to a second gate of the second transistor,
wherein the feedback circuit is connected to an output of the QB node.

17. The gate driving circuit of claim 16, wherein the feedback circuit includes:
at least two feedback transistors having gates connected jointly to the output of the QB node and source nodes connected jointly to a feedback line for transferring the feedback voltage.

18. The gate driving circuit of claim 15, wherein the compensating high-potential gate voltage corresponds to a second high-potential gate voltage driving the Q node stabilization unit.

19. The gate driving circuit of claim 15, wherein the feedback circuit includes at least one feedback transistor having a gate node connected to the QB node, a drain node connected to a node for supplying the first low-potential gate voltage, and a source node connected to a feedback line for transferring the feedback voltage.

20. A power management circuit, comprising:
a high-potential gate voltage, configured to:
receive a feedback voltage, and
output a compensating high-potential gate voltage based on the feedback voltage,
wherein the high-potential gate voltage compensation circuit includes:
an amplifier having a non-inverting input terminal to which the feedback voltage is applied;
a reference resistor connected to an inverting input terminal of the amplifier to transfer a reference voltage;
at least one setting resistor connected to the non-inverting input terminal of the amplifier to transfer at least one setting voltage; and
a feedback resistor connected between the inverting input terminal and an output terminal of the amplifier.

21. A display device, comprising:
a display panel having a plurality of subpixels;
a gate driving circuit configured to supply a plurality of scan signals to the display panel through a plurality of gate lines, and output a feedback voltage;
a data driving circuit configured to supply a plurality of data voltages to the display panel through a plurality of data lines;
a power management circuit configured to:
supply a plurality of driving voltages to the gate driving circuit and the data driving circuit, and
supply a compensating high-potential gate voltage to the gate driving circuit based on the feedback voltage transferred from the gate driving circuit; and
a timing controller configured to control the gate driving circuit, the data driving circuit, and the power management circuit,
wherein the gate driving circuit includes a plurality of gate driving integrated circuits,
wherein at least one of the plurality of gate driving integrated circuits is configured as a feedback gate driving integrated circuit including a feedback circuit for outputting the feedback voltage, and
wherein the data driving circuit includes:
an analog-to-digital converter configured to sense a voltage of a sensing line and convert the voltage into digital data;
a characteristic value sensing switch configured to control a connection between the sensing line and a node to which a sensing reference voltage is supplied;
a gate sensing switch configured to control a connection between the sensing line and a node to which the compensating high-potential gate voltage is supplied; and
a sampling switch configured to control a connection between the sensing line and the analog-to-digital converter.

\* \* \* \* \*